United States Patent
Park et al.

(10) Patent No.: US 9,111,843 B2
(45) Date of Patent: Aug. 18, 2015

(54) LED DISPLAY APPARATUS HAVING ACTIVE DEVICES AND FABRICATION METHOD THEREOF

(75) Inventors: Byung-Gook Park, Seoul (KR); Chang Su Seo, Hwaseong-si (KR); Byung Doo Yoo, Seoul (KR); Keun Kee Hong, Seoul (KR); Sang Yeop Jee, Incheon (KR); Jae Min Jeong, Seoul (KR)

(73) Assignee: SNU R&DB FOUNDATION (JP)

( * ) Notice: Subject to any disclaimer, the term of this patent is extended or adjusted under 35 U.S.C. 154(b) by 1148 days.

(21) Appl. No.: 13/095,295

(22) Filed: Apr. 27, 2011

(65) Prior Publication Data

US 2011/0273410 A1 Nov. 10, 2011

(30) Foreign Application Priority Data

May 7, 2010 (KR) ........................ 10-2010-0042869

(51) Int. Cl.
*H01L 25/16* (2006.01)
*H01L 23/00* (2006.01)
*H01L 27/12* (2006.01)
*H01L 33/20* (2010.01)
*H01L 33/40* (2010.01)

(52) U.S. Cl.
CPC .............. *H01L 25/167* (2013.01); *H01L 24/95* (2013.01); *H01L 27/1214* (2013.01); *H01L 27/1255* (2013.01); *H01L 33/20* (2013.01); *H01L 33/40* (2013.01); *H01L 2224/95085* (2013.01); *H01L 2924/12041* (2013.01)

(58) Field of Classification Search
CPC ....... H01L 25/167; H01L 33/20; H01L 33/40; H01L 27/1255; H01L 27/1214; H01L 33/002; H01L 33/0025; H01L 33/30; H01L 33/305; H01L 33/32; H01L 33/325; H01L 33/28; H01L 33/285; H01L 33/34; H01L 33/343; H01L 33/346; H01L 33/36; H01L 33/405; H01L 33/42; H01L 33/0029; H01L 33/26; H01L 33/02
See application file for complete search history.

(56) References Cited

U.S. PATENT DOCUMENTS 5,545,291 A 8/1996 Smith et al.
6,291,896 B1 9/2001 Smith
(Continued)

FOREIGN PATENT DOCUMENTS

KR 1020030057967 7/2003
WO 00/46854 8/2010

*Primary Examiner* — Anthony Ho
*Assistant Examiner* — Samuel Lair
(74) *Attorney, Agent, or Firm* — Gerald E. Hespos; Michael J. Porco; Matthew T. Hespos

(57) ABSTRACT

An active matrix LED display apparatus and a fabrication method thereof are provided. The active matrix LED display apparatus enables to miniaturize pixel by a formation of wiring on bottom layer and an assembly of each block through each eutectic layer into each transistor block receptor and/or each LED block receptor formed according to each color element unit, and to be embodied with high luminance, low power consumption, high reliability and superior optical property by assembling a transistor block having high electron mobility. And the fabricating method of the present invention enables to make efficiently an AM-LED display apparatus at room temperature in a short time by using different shapes of receptor and block depending on the function of a transistor and/or on the color of an LED.

15 Claims, 18 Drawing Sheets

(56) References Cited

U.S. PATENT DOCUMENTS

| | | | |
|---|---|---|---|
| 7,935,969 B2* | 5/2011 | Yamashita et al. | 257/72 |
| 2006/0012053 A1* | 1/2006 | Lai | 257/778 |
| 2006/0163596 A1* | 7/2006 | Kim et al. | 257/98 |
| 2007/0145383 A1* | 6/2007 | Rho et al. | 257/79 |
| 2008/0093602 A1* | 4/2008 | Matsumura et al. | 257/71 |
| 2009/0200555 A1* | 8/2009 | Ishihama | 257/59 |
| 2010/0267176 A1* | 10/2010 | Liu et al. | 438/25 |
| 2011/0101393 A1* | 5/2011 | Hsu et al. | 257/98 |

\* cited by examiner

LED DISPLAY APPARATUS HAVING ACTIVE DEVICES AND FABRICATION METHOD THEREOF

CROSS-REFERENCE TO RELATED APPLICATION

This application claims priority under 35 U.S.C. 119 of Korean Patent Application 10-2010-0042869 filed on May 7, 2010, the entire contents of which are hereby incorporated by reference.

BACKGROUND OF THE INVENTION

1. Field of the Invention

The present invention relates to an active matrix display apparatus and a method for fabricating the same, and more particularly, to an active matrix LED display apparatus having an active matrix consisting of a transistor and a light emitting diode (LED) and to a fabrication method thereof.

2. Description of the Related Art

So far, the display devices are known such as a cathode ray tube (CRT), a plasma display panel (PDP), a field emission display (FED), a thin film transistor-liquid crystal display (TFT-LCD), and an active-matrix organic light-emitting diode (AMOLED).

The advantages and disadvantages of the known display devices are as like as followings.

The CRT is used to create a color image by an electron beam and has the relatively good performance. However, the CRT has problems such as a heavy weight, a wide thickness, and a higher voltage and power consumption. Therefore, the CRT display has been preferably alternated with other thin flat panel display device due to the problem of the thickness.

The PDP is used to display a screen by a plasma discharge in spaces sealed with a front glass, a back glass and partition walls. However, the PDP has problems related to low image resolution and high driving voltage.

The FED uses a field emission cathode to provide electrons that strike colored phosphor to produce a color image. The FED has a high luminance and a high sense of color. However, the FED has problems such as a fast thermal degradation of the cathode and a stability of high vacuum state.

The TFT-LCD is consisted of a bottom plate with TFT element, an upper plate with color filter, and a liquid crystal locating between the bottom and the upper plates. The TFT-LCD controls an emitting light of a back light using a slope of the liquid crystal by a voltage difference. The TFT-LCD is used widely due to the some advantages such as a thin film, a high resolution, and a long life time. However, because the TFT-LCD is one of non-directly emitting elements, it shows bad in the properties of luminance, contrast, sight angle and response speed.

The AMOLED is used to drive an OLED device by TFT element and does not need a back light and a color filter. Therefore, the AMOLED has some advantages such as a simple fabrication, low power consumption, an ultrafine printing and a flexible display. However, the AMOLED has a short life time due to the using an organic electroluminescence diode and is not easy to make a large size due to the difficulty of molding.

The flat panel display (LCD, OLED, FED etc.) is divided to an active matrix and a passive matrix depending on the driving mode.

The passive matrix is consisted of grid of horizontal and vertical electrode lines. The intersection of grid is a pixel for emitting light. The passive matrix is a simple structure, but needs an instantly high luminance to recognize the pixel for short time. Therefore, the passive matrix has some disadvantages such as high power consumption due to the instant luminance, a difficulty in making large size due to the reduction of luminance by the increasing of the line number, and generally a reduction of life time.

On the other hand, the active matrix is consisted of one or more transistors in each pixel and capacitors to store an electric charge for emitting light. Therefore, the active matrix can be turned constantly on a driving state for one frame and be used to produce a display with good efficiency, low power consumption and large size.

The light emitting diode (LED) according to the present invention is a kind of solid element enabling to convert an electric energy into light and is used to an illuminator, a back light unit of LCD and a display apparatus.

Specifically, a non-organic LED is a light emitting element with some advantages such as high efficiency for reducing the power consumption, high color purity for producing the display with good color reproducing ratio, rapid light emitting property due to the using of electron and hole with very high electrical mobility, a long life time, a low environmental pollution due to the using of non-mercury material, and considerably high reliability.

Among display applications, TV is required the most long life time as more than 30,000 hours. The commercial LED is taken more than 50,000 hours of life time and so is sufficient to apply TV display.

Also, the commercial LED has over 100 lm/W of luminous efficiency which is enough to embody a display with an ultrahigh luminance and low power consumption against OLED. Additionally, compared to the TFT-LCD having a back light of LED, the LED can make a display with very thin and considerably low power consumption and without the luminance loss by a liquid crystal, a polarizing film and a color filter.

By the advanced properties of the LED, the AM-LED driving by active matrix can be displayed with some advantages such as a directly emitting light, a long life time against the AMOLED with organic light emitting diode, high luminance and low power consumption. Also, the LED can be displayed with high reliability by good stability in the infinitesimal quantity of water and oxygen which cause serious thermal degradation in the organic light emitting diode.

The personal and household display applications have a medium and small size of display such as a cellular phone, a digital camera, a video camera, a navigation device, a PDA, handheld PCs, a PMP and so on, and also have a medium and large size of display such as a monitor, a notebook, a TV and so on.

Presently, the LED has many advantages compare to the other displays excepting the commercial TFT-LCD and AMOLED. However, for personal and household applications, the conventional LED shows some disadvantages such as an impossibility of a monolithic process for producing one substrate with red, green and blue elements and an expensiveness of a compound semiconductor for molding a whole substrate.

Generally, the commercial LED display has an electric bulletin board apparatus consisted of the LED modules. However, because a display of the electric bulletin board device is formed through matching each LED board and drive board up by the module consisted of one LED element, each pixel of the display can not be miniaturized to apply to the personal and household applications.

The robotic pick-and-place system can be used to assemble hetero devices on a substrate which is not formed by monolithic method. In a micron size of the device, it shows that the efficiency is reducing and the cost of process is increasing.

Consequently, in order to overcome the mentioned problems, some methods, as like as a fluidic self-assembly (FSA) process (e.g., U.S. Pat. No. 5,545,291), are developed to assemble on one substrate with structures, devices, and subsystems needed the incompatible fabricating process using particular forces such as capillary force, gravity, electronic force, and pattern recognition.

SUMMARY OF THE INVENTION

Technical Problem

The present invention is disclosed to overcome the problems in the formation of circuit structure for driving LED display apparatus and in the assembly of general LED display. More specifically, because the miniaturization of pixel to apply to personal and household applications is difficult by the known method of LED display assembly, namely, an individual integration of the LED module consisted of one LED device to a board applied for an electric bulletin board apparatus, the objective of this present invention is to disclose an LED display apparatus having an active device to be assembled with hetero LED devices, switching devices, and driving devices on the same one substrate and a fabrication method thereof to overcome the above problems.

Technical Solution

To achieve the mentioned objective, a first structure of an LED display apparatus according to the present invention, comprising: a buffer layer forming on a substrate; a switching transistor active layer and a driving transistor active layer formed separately from each other and having a source and a drain in both sides of the each active layer on the buffer layer in a color element unit; a first insulating layer formed to cover the switching and the driving transistor active layers on the substrate; a scan line formed across between the source and the drain of the switching transistor on the first insulating layer; a cathode line formed parallel to and separately from the scan line on the first insulating layer; a storage capacitor bottom electrode formed across between the source and the drain of the driving transistor and connected electrically to the drain of the switching transistor on the first insulating layer in a color element unit; a second insulating layer formed to cover the scan line, the cathode line and the storage capacitor bottom electrode on the first insulating layer; a data line formed vertically to the scan line and connected electrically to the source of the switching transistor on the second insulating layer; a power supply line formed parallel to and separately from the data line and connected electrically to the source of the driving transistor on the second insulating layer; a storage capacitor top electrode formed to overlap the storage capacitor bottom electrode and connected electrically to the power supply line on the second insulating layer in a color element unit; an anode contact layer formed between the data line and the power supply line and connected electrically to the drain of the driving transistor on the second insulating layer in a color element unit; an LED block receptor formed with a third insulating layer to cover at least one part of the data line, the power supply line, the storage capacitor top electrode and the anode contact layer on the second insulating layer in a color element unit; a cathode eutectic layer and an anode eutectic layer formed separately from each other and connected electrically to the cathode line and the anode contract layer, respectively, in the LED block receptor; and an LED block of the color element unit assembled into the LED block receptor through electrical connections of the cathode eutectic layer and the anode eutectic layer to a cathode electrode and an anode electrode of the LED block, respectively.

A second structure of an LED display apparatus according to the present invention, comprising: a data line, a scan line and a cathode line formed parallel to and separately from each other on a substrate; a storage capacitor bottom electrode formed between the scan line and the cathode line in a color element unit; a first insulating layer formed to cover the data line, the scan line, the cathode line and the storage capacitor bottom electrode on the substrate; a power supply line formed vertically to the data line on the first insulating layer; a storage capacitor top electrode formed to overlap the storage capacitor bottom electrode and connected electrically to the power supply line on the first insulating layer in a color element unit; an anode contact layer formed separately from the power supply line on the first insulating layer in a color element unit; a switching transistor receptor, a driving transistor receptor and an LED block receptor formed with a second insulating layer to cover at least one part of the power supply line, the storage capacitor top electrode and the anode contact layer on the first insulating layer in a color element unit; a source eutectic layer, a gate eutectic layer and a drain eutectic layer of a switching transistor formed separately from each other and connected electrically to the data line, the scan line and the storage capacitor bottom electrode, respectively, in the switching transistor receptor; a gate eutectic layer, a source eutectic layer and a drain eutectic layer of a driving transistor formed separately from each other and connected electrically to the storage capacitor bottom electrode, the power supply line and the anode contact layer, respectively, in the drive transistor receptor; a cathode eutectic layer and an anode eutectic layer formed separately from each other and connected electrically to the cathode line and the anode contact layer, respectively, in the LED block receptor; a switching transistor block of the color element unit assembled into the switching transistor receptor through electrical connections of the source eutectic layer, the gate eutectic layer and the drain eutectic layer of the switching transistor to a source electrode, a gate electrode and a drain electrode of the switching transistor block, respectively; a driving transistor block of the color element unit assembled into the driving transistor receptor through electrical connections of the source eutectic layer, the gate eutectic layer and the drain eutectic layer of the driving transistor to a source electrode, a gate electrode and a drain electrode of the driving transistor block, respectively; and an LED block of the color element unit assembled into the LED block receptor through electrical connections of the cathode eutectic layer and the anode eutectic layer to a cathode electrode and an anode electrode of the LED block, respectively.

A third structure of an LED display apparatus according to the present invention, comprising: a power supply line formed on a substrate; a storage capacitor bottom electrode connected electrically and vertically to the power supply line on the substrate in a color element unit; a first insulating layer formed to cover the power supply line and the storage capacitor bottom electrode on the substrate; a data line and a scan line formed parallel to each other and formed vertically to the power supply line on the first insulating layer; a storage capacitor top electrode formed to overlap the storage capacitor bottom electrode and formed near by the scan line on the first insulating layer in a color element unit; an anode contact layer formed separately from and near by the storage capacitor top electrode on the first insulating layer in a color element unit; a switching transistor receptor, a driving transistor receptor and an LED block receptor formed with a second insulating layer to cover at least one part of the data line, the scan line, the storage capacitor top electrode and the anode contact layer on the first insulating layer in a color element unit; a source eutectic layer, a gate eutectic layer and a drain eutectic layer of a switching transistor formed separately from each other and connected electrically to the data line, the scan line and the storage capacitor top electrode, respectively, in the switching transistor receptor; a gate eutectic layer, a source eutectic layer and a drain eutectic layer of a driving transistor formed separately from each other and connected electrically to the storage capacitor top electrode, the power supply line and the anode contact layer, respectively, in the driving transistor receptor; an anode eutectic layer connected electrically to the anode contact layer in the LED block receptor; a switching transistor block of the color element unit assembled into the switching transistor receptor through electrical connections of the source eutectic layer, the gate eutectic layer and the drain eutectic layer of the switching transistor to a source electrode, a gate electrode and a drain electrode of the switching transistor block, respectively; a driving transistor block of the color element unit assembled into the driving transistor receptor through electrical connections of the source eutectic layer, the gate eutectic layer and the drain eutectic layer of the driving transistor to a source electrode, a gate electrode and a drain electrode of the driving transistor block, respectively; an LED block of the color element unit assembled into the LED block receptor through electrical connection of the anode eutectic layer to an anode electrode of the LED block ; a color element defining layer formed with a third insulating layer to expose a part of the LED block on the substrate assembled with the each block; and a cathode line formed to connect electrically to the exposed part of the LED block on the color element defining layer.

A method for fabricating the first structure of an LED display apparatus according to the present invention, comprising: a first step, depositing a buffer layer on a display substrate and forming a switching transistor active layer and a driving transistor active layer in a color element unit; a second step, depositing sequentially a first insulating layer and a conductive material on a whole surface of the substrate and etching the conductive material to form a scan line, a cathode line and a storage capacitor bottom electrode; a third step, depositing sequentially a second insulating layer and a conductive material on a whole surface of the substrate and etching the conductive material to form a data line, a power supply line, a storage capacitor top electrode and an anode contact layer; a fourth step, depositing a third insulating layer on a whole surface of the substrate, etching the third insulating layer to form an LED block receptor in a color element unit and forming a cathode eutectic layer and an anode eutectic layer in the LED block receptor; and a fifth step, assembling an LED block of the color element unit into the LED block receptor by a fluidic self-assembly process.

A method for fabricating the second structure of an LED display apparatus according to the present invention, comprising: a first step, depositing a conductive material on a display substrate and etching the conductive material to form a data line, a scan line, a cathode line and a storage capacitor bottom electrode; a second step, depositing sequentially a first insulating layer and a conductive material on a whole surface of the substrate and etching the conductive material to form a power supply line, a storage capacitor top electrode and an anode contact layer; a third step, depositing a second insulating layer on a whole surface of the substrate, etching the second insulating layer to form a switching transistor block receptor, a driving transistor block receptor and an LED block receptor in a color element unit and forming eutectic layer in the each block receptor; and a fourth step, assembling a switching transistor block, a driving transistor block and an LED block into the each receptor by a fluidic self-assembly process.

A method for fabricating the third structure of an LED display apparatus according to the present invention, comprising: a first step, depositing a conductive material on a display substrate and etching the conductive material to form a power supply line and a storage capacitor bottom electrode; a second step, depositing sequentially a first insulating layer and a conductive material on a whole surface of the substrate and etching the conductive material to form a data line, a scan line, a storage capacitor top electrode and an anode contact layer; a third step, depositing a second insulating layer on a whole surface of the substrate, etching the second insulating layer to form a switching transistor block receptor, a driving transistor block receptor and an LED block receptor in a color element unit and forming eutectic layer in the each block receptor; a fourth step, assembling a switching transistor block, a driving transistor block and an LED block into the each receptor by a fluidic self-assembly process; a fifth step, depositing a third insulating layer on a whole surface of the substrate and etching the third insulating layer to form a color element defining layer for exposing the assembled LED block partially; and a sixth step, depositing a transparent or a semi-transparent conductive material and forming a cathode contact layer to connect electrically to the exposed LED block.

Advantageous Effect

An LED display apparatus of the present invention enables to miniaturize pixel by a formation of wiring on bottom layer and an assembly of each block through each eutectic layer into each transistor block receptor and/or each LED block receptor formed according to each color element unit. Therefore, the LED display apparatus can apply to personal and household applications and can embody AM-LED display apparatus with high luminance, low power consumption, high reliability, and superior optical property by assembling a transistor block having high electron mobility.

And a fabricating method of an LED display apparatus according to the present invention comprises forming transistor block receptor and LED block receptor on a display substrate and assembling a prepared single-crystal silicon transistor block and a prepared LED block into the each block receptor by a fluidic self-assembly process. Consequently, the fabricating method of the present invention enables to make efficiently an AM-LED display apparatus at room temperature in a short time by using different shapes of receptor and block depending on the function of a transistor and on the color of an LED.

BRIEF DESCRIPTION OF THE DRAWINGS

The invention may be better understood by the drawings that are briefly described below and attached hereto, in the several figures of which identical reference numbers (if any) refer to identical or similar elements.

In these drawings, the following reference numbers are used throughout: reference number 1 indicates a color element, 2 means a pixel, 3 means a substrate, 4 means an LED block of color element R, 5 means an LED block of color element G, 6 means an LED block of color element B, 7 means a switching transistor block, 8 means a driving transistor block, 10 means a display substrate, 20, 40, 70, 72, 72a, 91, 91a, 92, 93, 93a, 94, and 95 mean a insulating layer, 30 means a driving transistor active layer, 41 means an LED block receptor, 50 and 85a mean a storage capacity bottom electrode, 50a and 85 mean a storage capacity top electrode, 60 and 60a mean a cathode line, 71 means a switching transistor block receptor, 80 and 80a mean a scan line, 81 means a driving transistor block receptor, 82 and 82a mean a power supply line, 83, 83a and 83b mean a data line, 84 and 84a mean a anode contact layer, 96 means a color element defining layer, 100 means a receptor, 200, 212, 214, 222, 224, 226, 232, 234, 236, 242, 244 and 246 mean an eutectic layer, and 300 means a block.

DETAILED DESCRIPTION OF THE PREFERRED EMBODIMENTS

A detailed description of preferred embodiments of the present invention is provided below with respect to the accompanying drawings.

Figure 1:
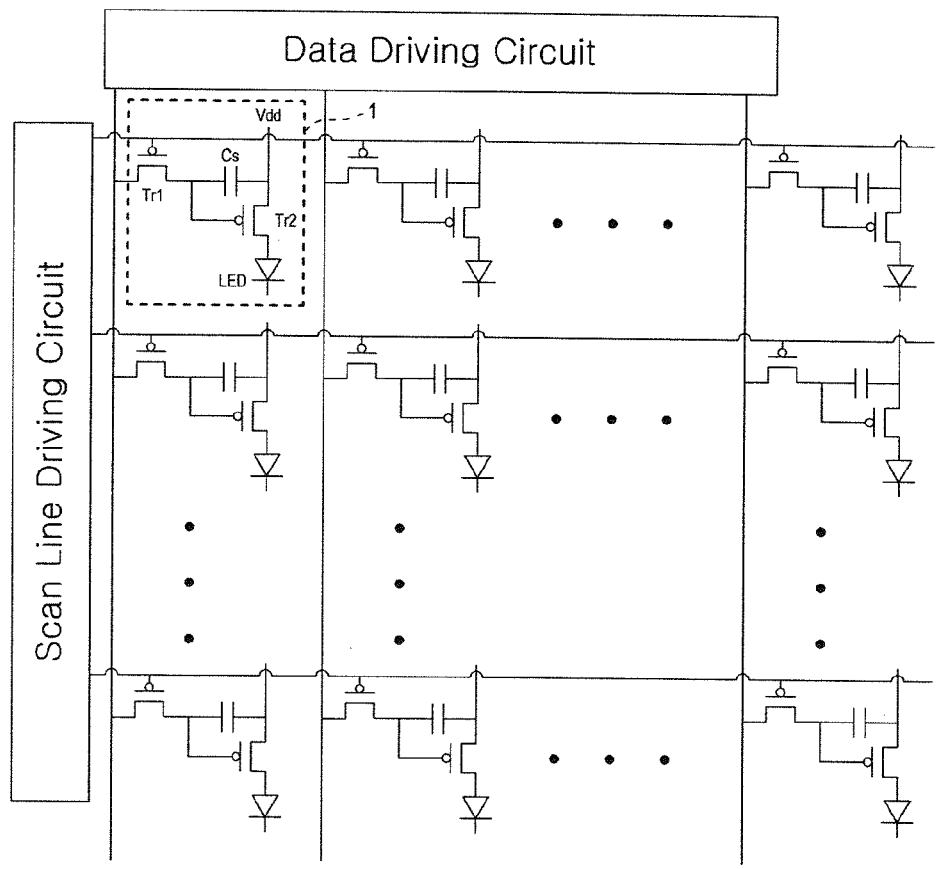
FIG. 1 is a circuit diagram for embodying an AM-LED display apparatus according to the present invention.

The present invention, as shown in FIG. 1, is related to an active matrix (AM)-LED display apparatus, basically comprising: a data driving circuit and a scan line driving circuit; a data line and a scan line connected to the data driving circuit and the scan line driving circuit, respectively; an active matrix which is controlled by the each line and is consisted of a switching transistor Tr1, a driving transistor Tr2, a color element driving storage capacitor Cs and a light emitting diode LED in a color element unit 1; and a power supply line Vdd connected to a drain of the each driving transistor Tr2.

In order to drive a light emitting diode LED of one color element 1 in an AM-LED display apparatus according to the present invention, when a select signal is transferred to a scan line, which crosses the color element 1, a switching transistor Tr1 is turned on and then a data voltage of a data line through the color element 1 is transferred to a gate of a driving transistor Tr2 and simultaneously charges a storage capacitor Cs.

At this time, the data voltage or the charged voltage of the storage capacitor Cs becomes a voltage between a source and a gate of the driving transistor Tr2 and then a current corresponded to the voltage flows from a power supply line Vdd through the driving transistor Tr2 to a light emitting diode LED of the color element 1. Consequently, the LED emits light corresponding to the current.

Therefore, for controlling a light intensity of an LED, the voltage between a source and a gate of the driving transistor Tr2, namely, the voltage of the storage capacitor Cs can be regulated.

Figure 2:
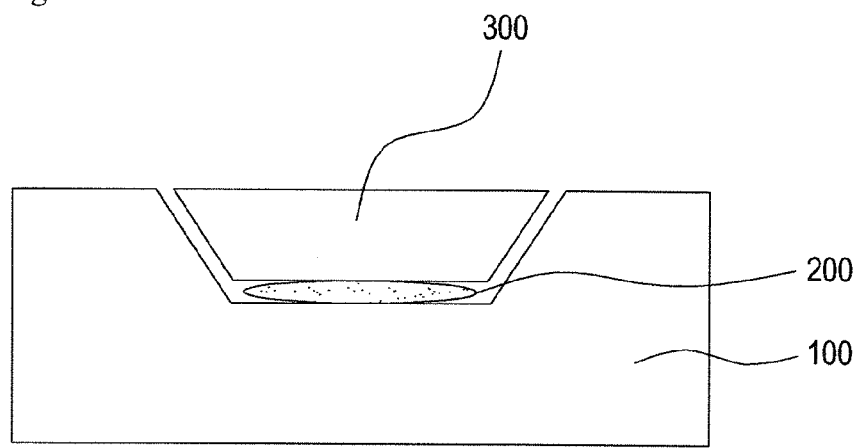
FIG. 2 is a cross-section view of a structure of a block assembled into a receptor through eutectic layer by a fluidic self-assembly process (FSA).

An AM-LED display apparatus according to the present invention is characterized by forming each transistor Tr1, Tr2 and/or an LED of a color element unit 1 in FIG. 1 into a block 300, respectively, and assembling the each transistor block and/or the LED block 300 through an eutectic layer 200 into a receptor 100 formed to have each exposed wiring of a bottom layer on a display substrate as shown in FIG. 2.

Here, the eutectic layer 200 is a material layer consisted of a metal or a molten alloy (i.e., a metal compound) with a melting point lower than those of the exposed wiring made of a conductive material such as a metal on the bottom of the receptor 100 and the each electrode made of a conductive material such as a metal of the block 300.

Figure 3:
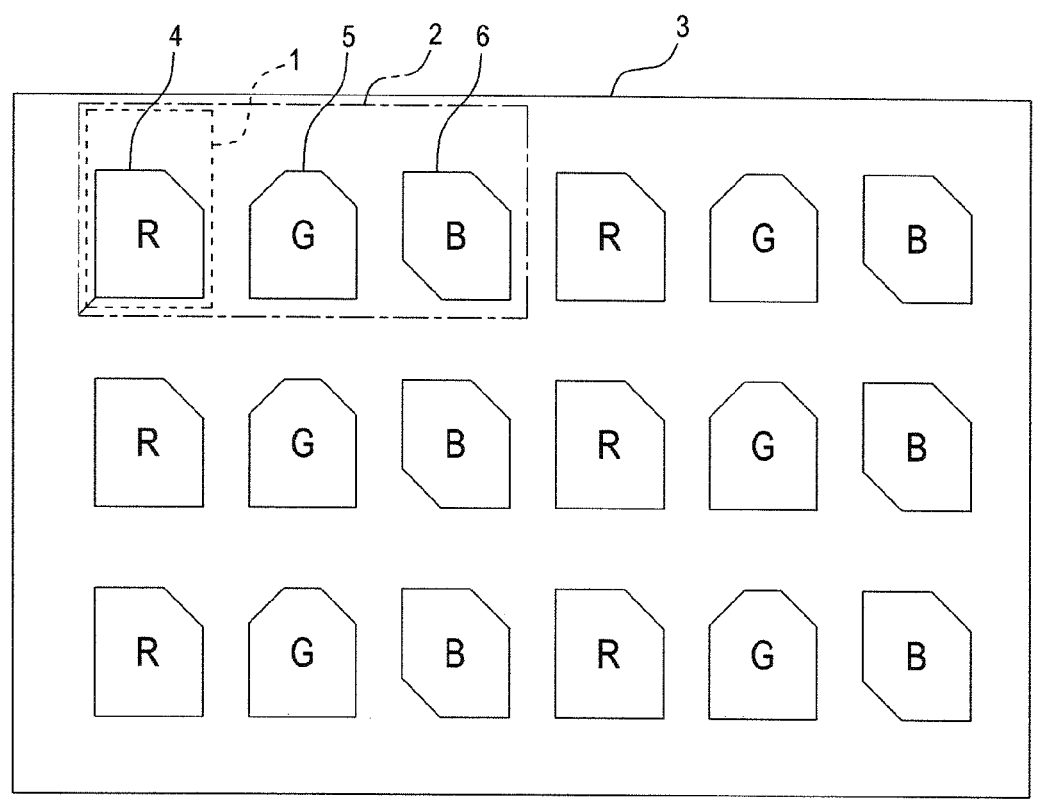
FIG. 3 is a plane view of structures of LED blocks assembled into LED block receptors which have different shapes depending on a color element R (Red), G (Green), or B (Blue) in an AM-LED display apparatus according to the present invention.
Figure 10:
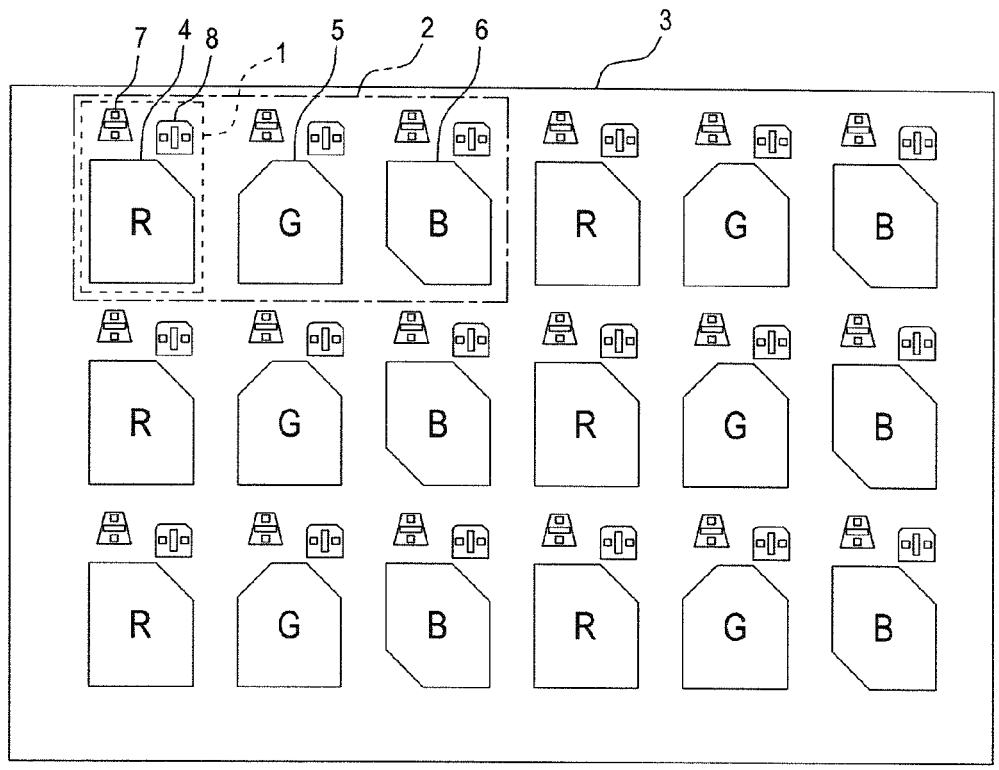
FIG. 10 is a plane view of structures of LED blocks assembled into LED block receptors which have different shapes depending on a color element R, G, and B and structures of transistor blocks assembled into switching and driving transistor block receptors which have different shapes depending on the function of transistor in an AM-LED display apparatus according to the present invention.

And, in the specification of the present invention, a color element is defined as a basic color of light, i.e., one of R (red), G (green) and B (blue), and a pixel 2 comprises three color elements R, G, and B as shown in FIGS. 3 and 10.

Referring to FIGS. 3 to 32, preferred embodiments of an AM-LED display apparatus and a fabricating method thereof according to the present invention are described in detail as follow:

[First Embodiment]

A structure of an AM-LED display apparatus according to a first embodiment of the present invention comprises basically, as shown in FIG. 3, a plurality of pixels 2 formed on the display substrate 3 and consisted of three color element units 1, respectively. The each color element unit 1 comprises a switching transistor Tr1, a driving transistor Tr2 and an LED. Here, the switching transistor Tr1 and the driving transistor Tr2 are built in the display substrate 3. And the LED is formed by assembling an LED block 4 made previously into a block receptor formed on the substrate 3.

Figure 4:
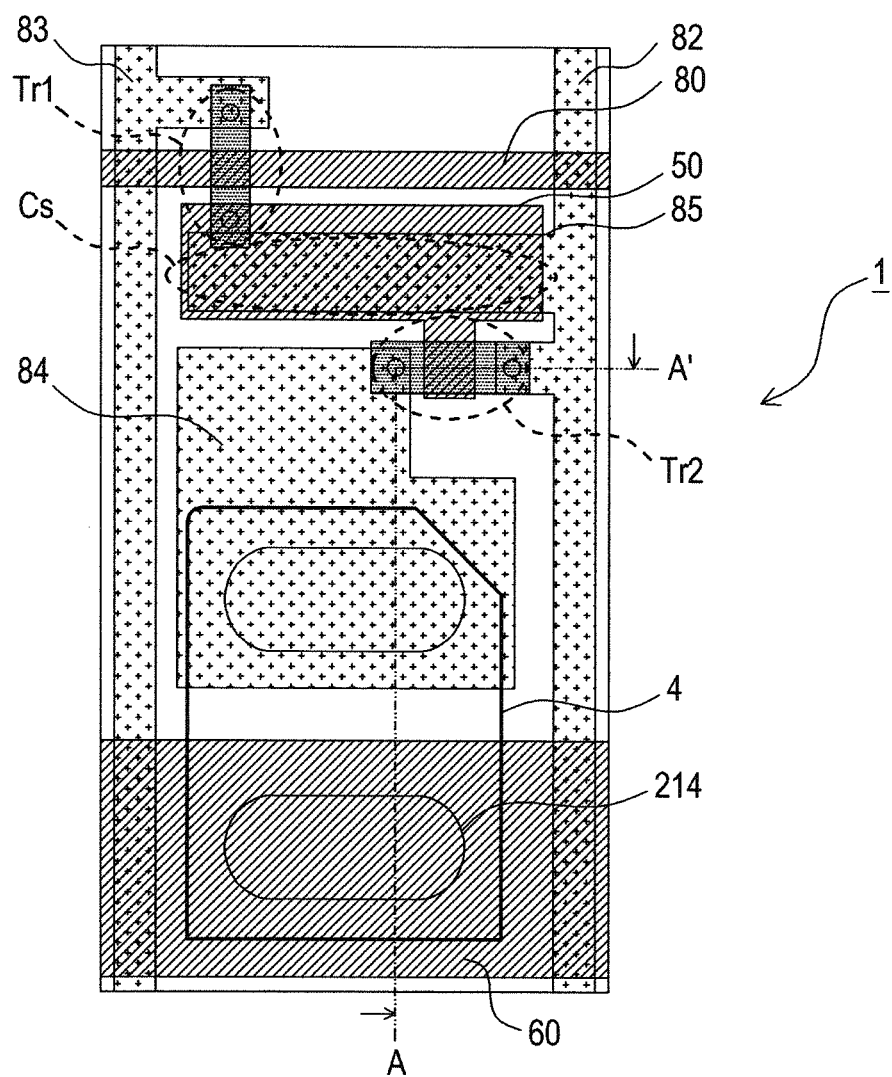
FIG. 4 is a layout to illustrate a structure of any one color element in FIG. 3.

A plane structure of one color element unit 1 according to the first embodiment is shown with a layout in FIG. 4. The structures formed on the same layer are marked with the same color in FIG. 4.

As shown in FIGS. 4 to 8, a structure according to the first embodiment is characterized by comprising: a buffer layer 20 formed on a substrate 10; a switching transistor Tr1 active layer (not shown) and a driving transistor Tr2 active layer 30 formed separately from each other and having a source 32 and a drain 34 in both sides of the each active layer on the buffer layer 20 in a color element unit 1; a first insulating layer 40 formed to cover the switching and the driving transistor active layers on the substrate 10; a scan line 80 formed across between the source and the drain of the switching transistor Tr1 on the first insulating layer 40; a cathode line 60 formed parallel to and separately from the scan line 80 on the first insulating layer 40; a storage capacitor bottom electrode 50 formed across between the source and the drain of the driving transistor Tr2 and connected electrically to the drain of the switching transistor Tr1 on the first insulating layer 40 in a color element unit 1; a second insulating layer 70 formed to cover the scan line 80, the cathode line 60 and the storage capacitor bottom electrode 50 on the first insulating layer 40; a data line 83 formed vertically to the scan line 80 and connected electrically to the source of the switching transistor Tr1 on the second insulating layer 70; a power supply line 82 formed parallel to and separately from the data line 83 and connected electrically to the source 32 of the driving transistor Tr2 on the second insulating layer 70; a storage capacitor top electrode 85 formed to overlap the storage capacitor bottom electrode 50 and connected electrically to the power supply line 82 on the second insulating layer 70 in a color element unit 1; an anode contact layer 84 formed between the data line 83 and the power supply line 82 and connected electrically to the drain 34 of the driving transistor Tr2 on the second insulating layer 70 in a color element unit 1; an LED block receptor 41 formed with a third insulating layer 92 or 94 to cover at least one part of the data line 83, the power supply line 82, the storage capacitor top electrode 85 and the anode contact layer 84 on the second insulating layer 70 in a color element unit 1; a cathode eutectic layer 214 and an anode eutectic layer 212 formed separately from each other and connected electrically to the cathode line 60 and the anode contact layer 84, respectively, in the LED block receptor 41; and an LED block 4 or 4a of the color element unit 1 assembled into the LED block receptor 41 through electrical connections of the cathode eutectic layer 214 and the anode eutectic layer 212 to a cathode electrode 46 or 46a and an anode electrode 47 or 47a, respectively.

Here, the buffer layer 20 can be a silicon oxide layer or a silicon nitride layer, and the switching transistor Tr1 active layer and the driving transistor Tr2 active layer 30 can be an amorphous silicon layer. But the driving transistor Tr2 active layer 30 is preferable to be a poly-silicon layer due to the operation of an LED by a driving current.

Additionally, the cathode eutectic layer 214 and the anode eutectic layer 212 are preferable to be a metal or a metal compound with a melting point lower than those of the scan line 80, the cathode line 60, the storage capacitor bottom electrode 50, the data line 83, the power supply line 82, the storage capacitor top electrode 85 and the anode contact layer 84.

Also, on the substrate assembled with the LED block 4 or 4a, a thin film encapsulation layer (not shown) can be additionally formed.

In the structure according to the first embodiment, the LED block receptor 41 has preferably a recessed region with different plane structure depending on a color element 1 as shown in FIG. 3 and the LED block 4 or 4a assembled into the LED block receptor 41 has also preferably an LED substrate 42 with a shape corresponded to the recessed region.

In this way, an LED display 3 can be evenly embodied with a plurality of pixels 2 consisted of three color elements R 4, G 5 and B 6, respectively.

More preferably, the LED block receptor 41 is formed to have the recessed region as a wide opening and a narrow bottom as shown in FIG. 2 and the LED block 4 or 4a is formed to correspond to the shape of the LED block receptor 41.

In this way, when each receptor receives each block by a self-shape recognition principle using gravity and/or fluid vibration, the mismatched blocks can be jumped out and the rightly received blocks are safely held by a capillary force.

Figure 6:
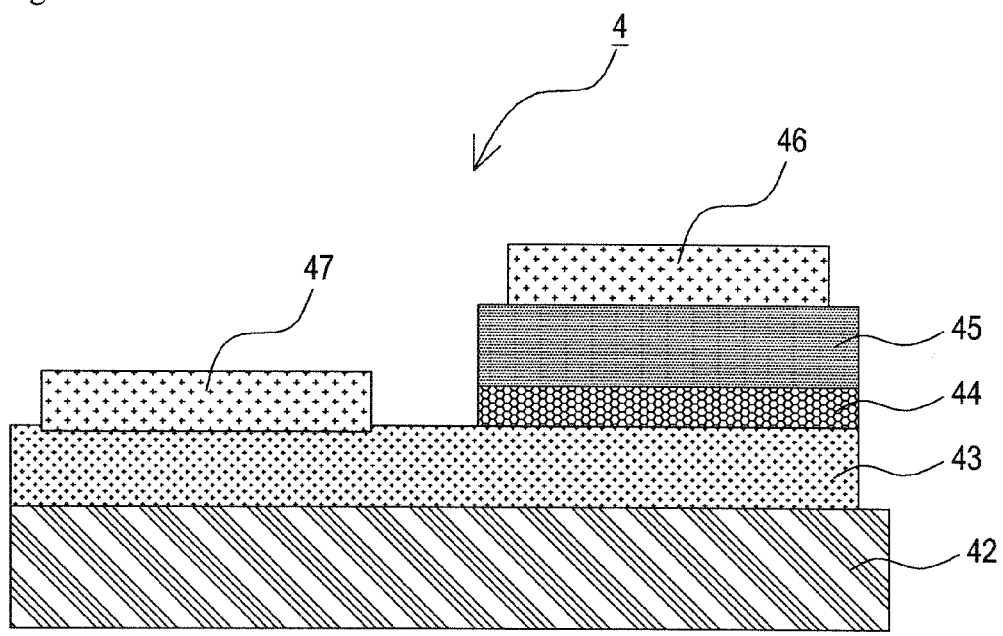
FIGS. 6 and 7 are cross-section views to illustrate a structure of an LED block assembled into an LED block receptor according to the present invention.
Figure 7:
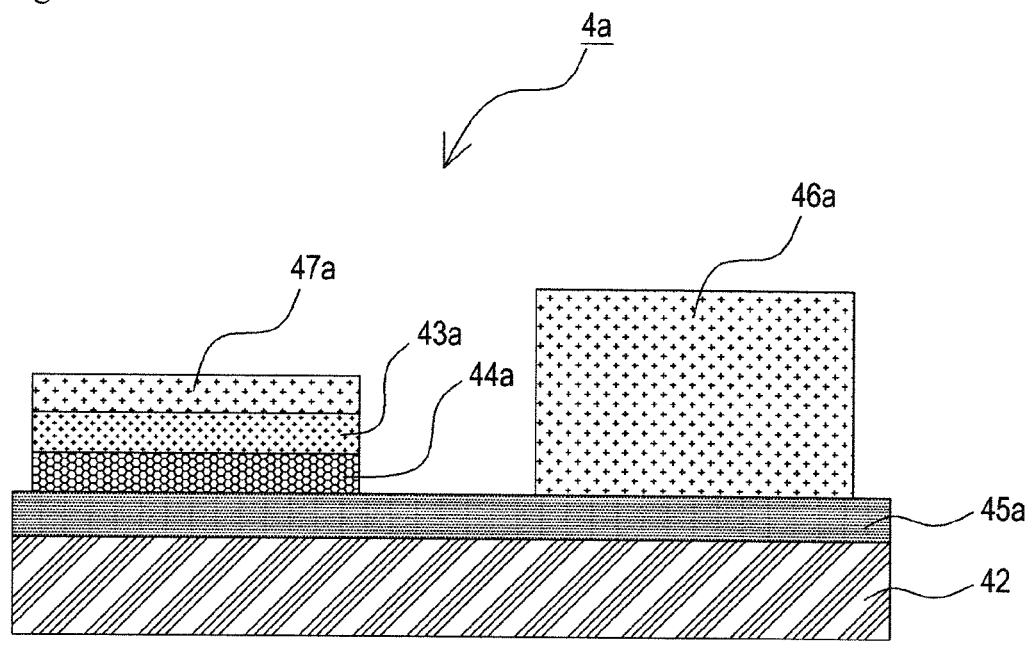

On the other hand, the LED block 4 or 4a assembled into the LED block receptor 41 can be formed to have a conventional LED structure. However, for corresponding to the shape of each LED block receptor 41, as shown in FIG. 6, the LED block 4 can be formed to have a p-type nitrogen compound semiconductor layer 43/nitrogen compound activation layer 44/n-type nitrogen compound semiconductor layer 45/cathode electrode 46 and a p-type nitrogen compound semiconductor layer 43/anode electrode 47 near by in the same direction of each other on the LED substrate 42, or as shown in FIG. 7, the LED block 4a can be formed to have an n-type nitrogen compound semiconductor layer 45a/nitrogen compound activation layer 44a/p-type nitrogen compound semiconductor layer 43a/anode electrode 47a and an n-type nitrogen compound semiconductor layer 45a/cathode electrode 46a near by in the same direction of each other on the LED substrate 42.

Here, the LED substrate 42 can be a sapphire substrate. Depending on each color element, the nitrogen compound can be preferable to be MN, GaN, InN, or a compound of nitrogen and two or more elements of Al, Ga and In. The anode electrode 47 or 47a and the cathode electrode 46 or 46a can be preferable to be Ti, W, Cr, Au, Ag, Ni, or a compound comprising one or more elements of Ti, W, Cr, Au, Ag and Ni.

Also, the cathode eutectic layer 214 and the anode eutectic layer 212 can be preferable to be a metal, more preferably one of Sn, Pb, Bi and In, a compound comprising one or more elements of Sn, Pb, Bi and In, or a metal compound comprising one element of Sn, Pb, Bi and In and one or more elements of Ag, Sb, Cu, Zn and Mg.

Next, with respect to FIGS. 1 to 9, a method for fabricating the structure of an AM-LED display apparatus according to a first embodiment of the present invention is described in detail.

Figure 8:
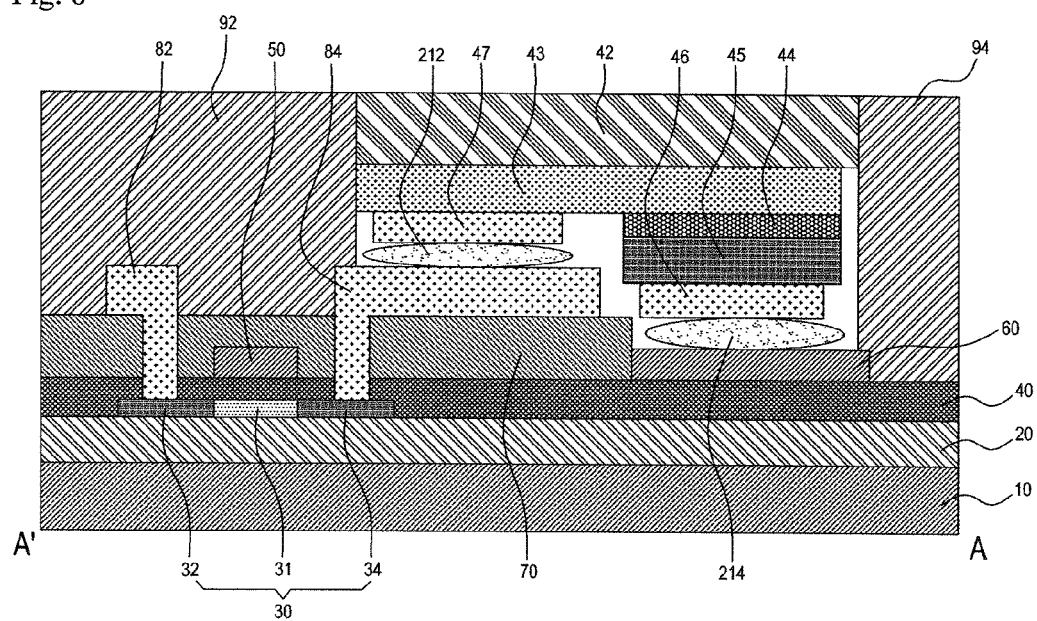
FIG. 8 is a cross-section view to illustrate a structure of the LED block in FIG. 6 assembled into the LED block receptor in FIG. 5.
Figure 9:
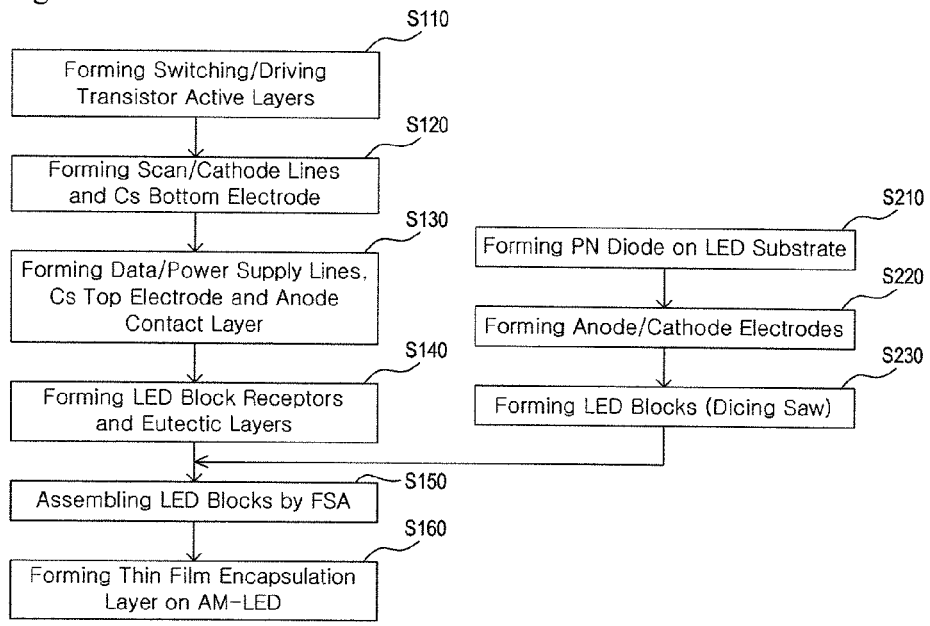
FIG. 9 is a flowchart for a first embodiment on a fabricating method of an AM-LED display apparatus according to the present invention.

First, as a first step S110, as shown in FIG. 8, a buffer layer 20 is deposited on a display substrate 10 and a switching transistor active layer (not shown) and a driving transistor active layer 30 is formed on the buffer layer 20 in a color element unit.

As a second step S120, as shown in FIGS. 4 and 8, a first insulating layer 40 and a conductive material are deposited sequentially on a whole surface of the substrate and the conductive material is etched to form a scan line 80, a cathode line 60 and a storage capacitor bottom electrode 50.

As a third step S130, a second insulating layer 70 and a conductive material are deposited sequentially on a whole surface of the substrate and the conductive material is etched to form a data line 83, a power supply line 82, a storage capacitor top electrode 85 and an anode contact layer 84.

Here, after depositing the second insulating layer 70, via holes are formed for contacting a source of a switching transistor, a source 32 and a drain 34 of a driving transistor before depositing the conductive material on the second insulating layer 70.

Figure 5:
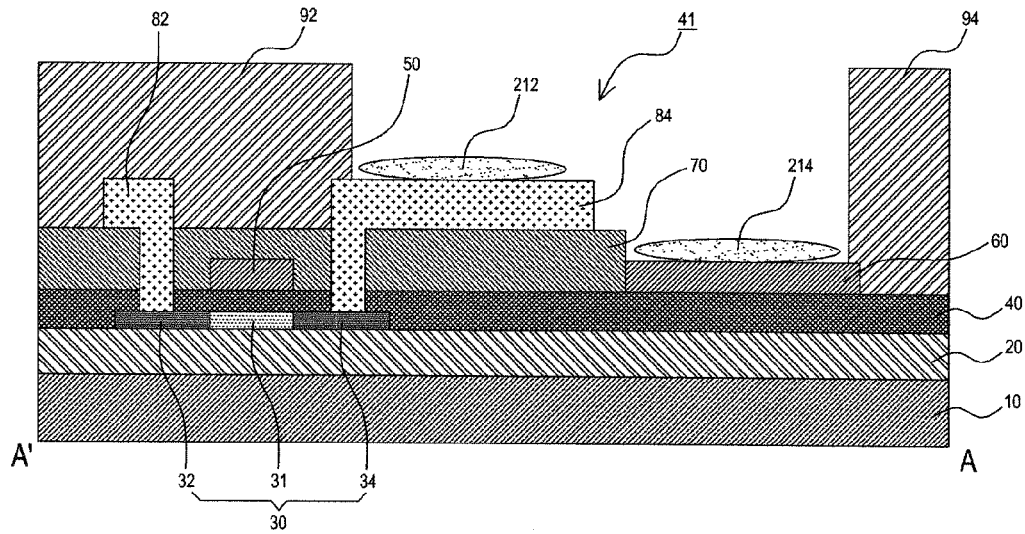
FIG. 5 is a cross-section view of a line AA' to illustrate a stacked structure and an LED block receptor according to the present invention.

As a fourth step S140, as shown in FIG. 5, a third insulating layer is deposited on a whole surface of the substrate and etched to form an LED block receptor 41 in a color element unit and a cathode eutectic layer 214 and an anode eutectic layer 212 are formed in the LED block receptor 41.

At this time, the LED block receptor 41, as shown in FIG. 3, can be formed to have a different shape depending on a color element, and additionally, can be preferable to be formed to have a recessed region with a wide opening and a narrow bottom as shown in FIG. 2.

As a fifth step S150, as shown in FIG. 8, an LED block 4 or 4a of the color element unit is assembled into the LED block receptor 41 by a fluidic self-assembly (FSA).

Here, the LED block 4 or 4a is fabricated by a separated process, which comprises forming a PN diode on an LED substrate (S210), forming an anode/a cathode electrode (S220) and forming an LED block 4 or 4a corresponded to the shape of an LED block receptor 41 by dicing saw (S230).

By the separating process, the LED block 4 or 4a is also fabricated to have a different shape depending on a color element and is put onto a substrate formed with the corresponding LED block receptor 41 and immersed in a fluid.

In the fluid, the LED block 4 or 4a can be moved by gravity and/or fluid vibration and can be safely received in the corresponding LED block receptor 41 by a self-shape recognition principle or hydrophilic and hydrophobic properties.

When each LED block receptor is formed to have a recessed region with a wide opening and a narrow bottom as shown in FIG. 2 and the LED block 4 or 4a is formed to correspond to the each LED block receptor 41 as mentioned above, the mismatched blocks can be jumped out by gravity and/or fluid vibration and the rightly received blocks are safely held by a capillary force.

After the LED block 4 or 4a is safely received into the LED block receptor 41, the temperature of the fluid is increased to the lowest melting point of the eutectic layers 212 and 214 and then decreased to completely assemble the cathode 46 or 46a and the anode 47 or 47a of the each LED block 4 or 4a with the exposed wirings in the LED block receptor 41.

The rate of assembly of the blocks into the each receptor can be increased by repeating the fifth step.

After the fluidic self-assembly (FSA) process in the fifth step, a vacant receptor in the entire pixels of display can be detected and saved with a coordinate site by using an automated optical inspection (AOI) and then can be assembled with the corresponded block by pick-and-place process using a robot.

The others, the undescribed parts, can be referred to the U.S. Pat. No. 5,545,291 related to the FSA process.

A further step S160, as an option, can be processed to form a thin film encapsulation layer on the substrate assembled with the LED block 4 or 4a.

[Second Embodiment]

A structure of an AM-LED display apparatus according to a second embodiment of the present invention comprises basically, as shown in FIG. 10, a plurality of pixels 2 formed on the display substrate 3 and consisted of three color element units 1, respectively. The each color element unit 1 is formed by assembling a switching transistor block 7, a driving transistor block 8 and an LED block 4 made previously into a switching transistor block receptor, a driving transistor block receptor and an LED block receptor, respectively, which are formed on the substrate 3.

Figure 11:
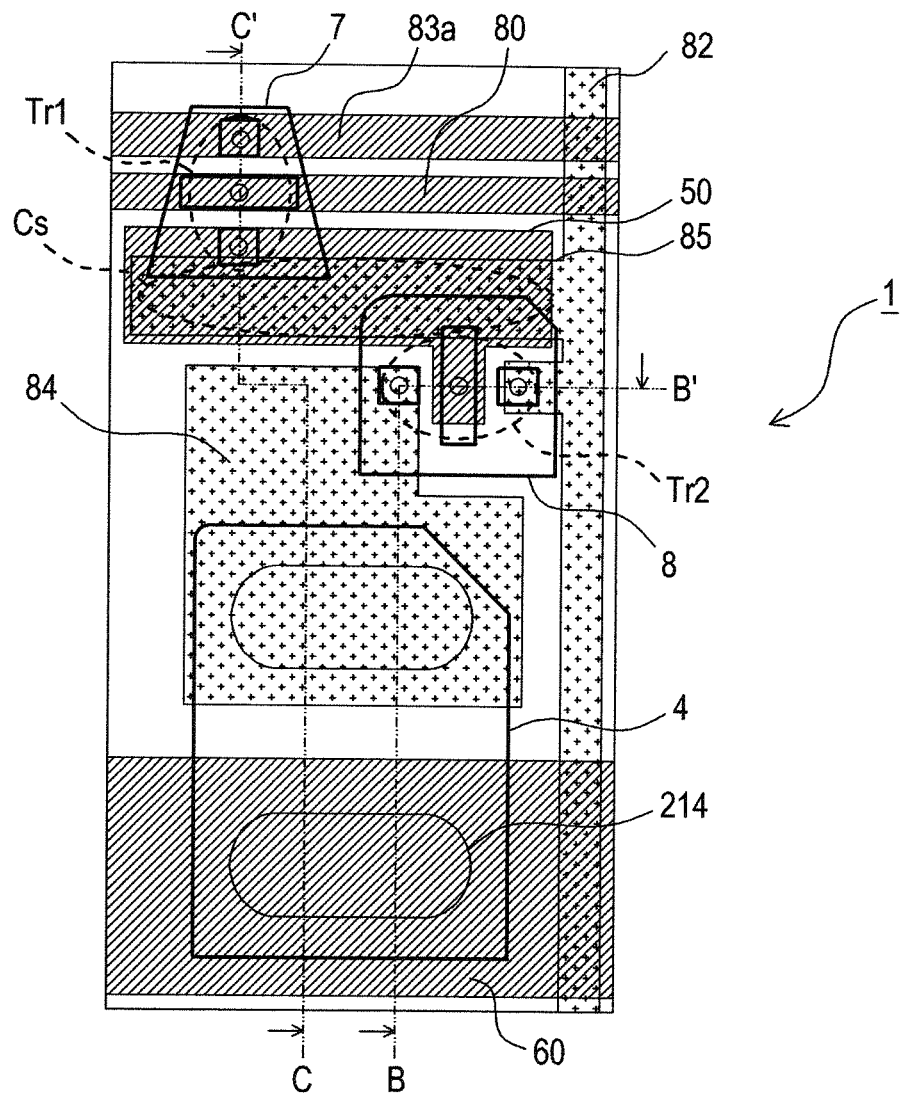
FIG. 11 is a layout to illustrate a structure of any one color element in FIG. 10.

The plane structure of one color element unit 1 according to the second embodiment is shown with a layout in FIG. 11. The structures formed on the same layer are marked with the same color in FIG. 11.

As shown in FIGS. 11 to 19, a structure according to the second embodiment is characterized by comprising: a data line 83a, a scan line 80 and a cathode line 60 formed parallel to and separately from each other on a substrate 10; a storage capacitor bottom electrode 50 formed between the scan line 80 and the cathode line 60 in a color element unit; a first insulating layer 72 formed to cover the data line 83a, the scan line 80, the cathode line 60 and the storage capacitor bottom electrode 50 on the substrate 10; a power supply line 82 formed vertically to the data line 83a on the first insulating layer 72; a storage capacitor top electrode 85 formed to overlap the storage capacitor bottom electrode 50 and connected electrically to the power supply line 82 on the first insulating layer 72 in a color element unit; an anode contact layer 84 formed separately from the power supply line 82 on the first insulating layer 72 in a color element unit; a switching transistor receptor 71, a driving transistor receptor 81 and a LED block receptor 41 formed with a second insulating layer 91, 91a, 93, 93a or 95 to cover at least one part of the power supply line 82, the storage capacitor top electrode 85 and the anode contact layer 84 on the first insulating layer 72 in a color element unit; a source eutectic layer 232, a gate eutectic layer 234 and a drain eutectic layer 236 of a switching transistor formed separately from each other and connected electrically to the data line 83a, the scan line 81 and the storage capacitor bottom electrode 50, respectively, in the switching transistor receptor 71; a gate eutectic layer 224, a source eutectic layer 222 and a drain eutectic layer 226 of a driving transistor formed separately from each other and connected electrically to the storage capacitor bottom electrode 50, the power supply line 82 and the anode contact layer 84, respectively, in the driving transistor receptor 81; a cathode eutectic layer 214 and an anode eutectic layer 212 formed separately from each other and connected electrically to the cathode line 60 and the anode contact layer 84, respectively, in the LED block receptor 41; a switching transistor block 7 of the color element unit assembled into the switching transistor receptor 71 through electrical connections of the source eutectic layer 232, the gate eutectic layer 234 and the drain eutectic layer 236 of the switching transistor to a source electrode 77, a gate electrode 78 and a drain electrode 79 of the switching transistor block, respectively; a driving transistor block 8 of the color element unit assembled into the driving transistor receptor 81 through electrical connections of the source eutectic layer 222, the gate eutectic layer 224 and the drain eutectic layer 226 of the driving transistor to a source electrode 807, a gate electrode 808 and a drain electrode 809 of the driving transistor block, respectively; and an LED block 4 or 4a of the color element unit assembled into the LED block receptor 41 through electrical connections of the cathode eutectic layer 214 and the anode eutectic layer 212 to a cathode electrode 46 or 46a and an anode electrode 47 or 47a of the LED block, respectively.

Here, the switching transistor Tr1 and the driving transistor Tr2 can be formed on an amorphous or polycrystal semiconductor substrate, but the driving transistor Tr2 is preferable to be formed on a single-crystal silicon substrate due to the operation of an LED by a driving current.

Also, the each eutectic layer 212, 214, 222, 224, 226, 232, 234 or 236 is preferable to be a metal or a metal compound with a meting point lower than those of the scan line 80, the cathode line 60, the storage capacitor bottom electrode 50, the power supply line 82, the storage capacitor top electrode 85, the anode contact layer 84, the each source electrode 77 or 807, the each gate electrode 78 or 808 and the each drain electrode 79 or 809.

Figure 17:
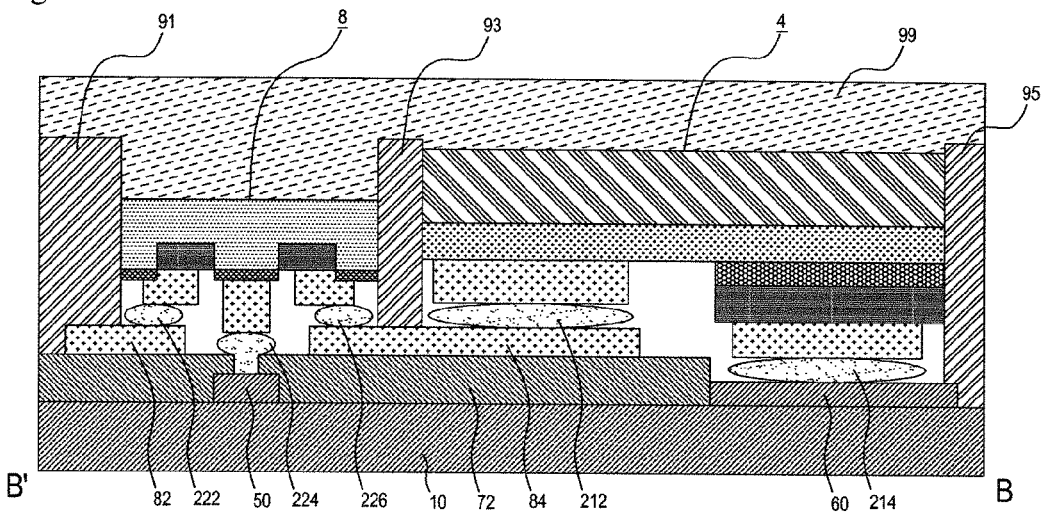

As an optional step, as shown in FIG. 17, a thin film encapsulation layer 99 can be formed on the substrate assembled with the switching transistor block 7, the driving transistor block 8 and the LED block 4 or 4a.

In the structure according to the second embodiment, the LED block receptor 41, as shown in FIG. 10, has preferably a recessed region with different plane structure depending on the color element and the LED block 4 or 4a assembled into the LED block receptor 41 has also preferably an LED substrate 42 with a shape corresponded to the recessed region.

In this way, an LED display 3 can be evenly embodied with a plurality of pixels 2 consisted of three color elements R 4, G 5 and B 6, respectively.

Also, as shown in FIG. 10, the switching transistor block receptor 71 has preferably a recessed region with different plane structure from the driving transistor block receptor 81 and each transistor block 7 or 8 assembled into the each transistor block receptor 71 or 81 has also preferably a transistor substrate 73 or 803 with a shape corresponded to the recessed region.

Figure 16:
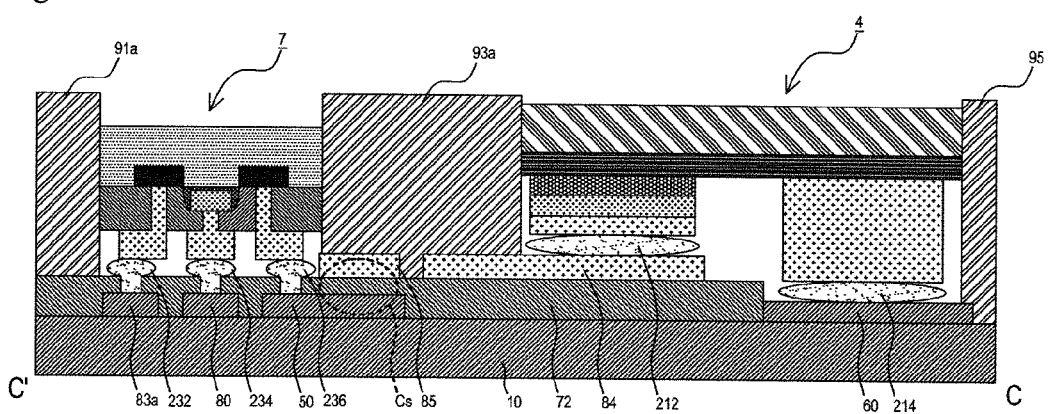

In this way, as shown in FIGS. 16 and 17, when the height of the eutectic layers 222, 224, 226, 232, 234 and 236 contacted to each electrode of the each transistor is different each other, an only corresponding transistor can be selected to assemble. Also, only driving transistors Tr2 formed on a single-crystal silicon substrate can be selected and used to assemble.

More preferably, as shown in FIG. 2, the LED block receptor 41 and the transistor block receptors 71 and 81 can be formed to have the recessed region with a wide opening and a narrow bottom, and the blocks 4, 4a, 7 and 8 can be formed to correspond to the shape of the each receptor.

In this case, when the blocks are safely received to the each receptor by a self-shape recognition principle using gravity and/or fluid vibration, the mismatched blocks can be jumped out and the rightly received blocks are safely held by a capillary force.

On the other hand, the LED block 4 or 4a assembled into the LED block receptor 41 can be formed to have a conventional LED structure. However, for corresponding to the shape of each LED block receptor 41, as shown in FIG. 6, the LED block 4 can be formed to have a p-type nitrogen compound semiconductor layer 43/nitrogen compound activation layer 44/n-type nitrogen compound semiconductor layer 45/cathode electrode 46 and a p-type nitrogen compound semiconductor layer 43/anode electrode 47 near by in the same direction of each other on the LED substrate 42, or as shown in FIG. 7, the LED block 4a can be formed to have an n-type nitrogen compound semiconductor layer 45a/nitrogen compound activation layer 44a/p-type nitrogen compound semiconductor layer 43a/anode electrode 47a and an n-type nitrogen compound semiconductor layer 45a/cathode electrode 46a near by in the same direction of each other on the LED substrate 42.

Figure 18:
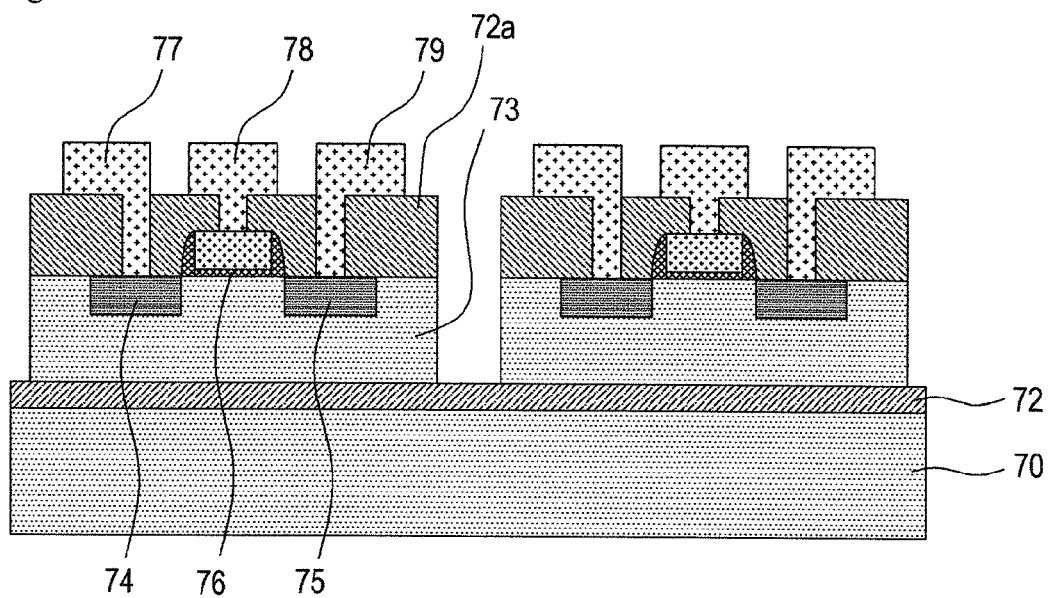
FIGS. 18 and 19 are cross-section views to illustrate different fabricating methods of a transistor block according to the present invention.
Figure 19:
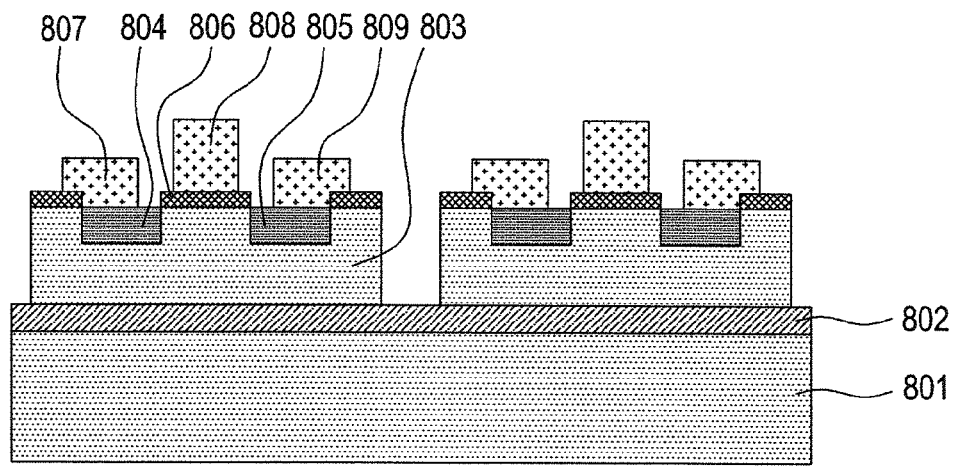
Figure 20:
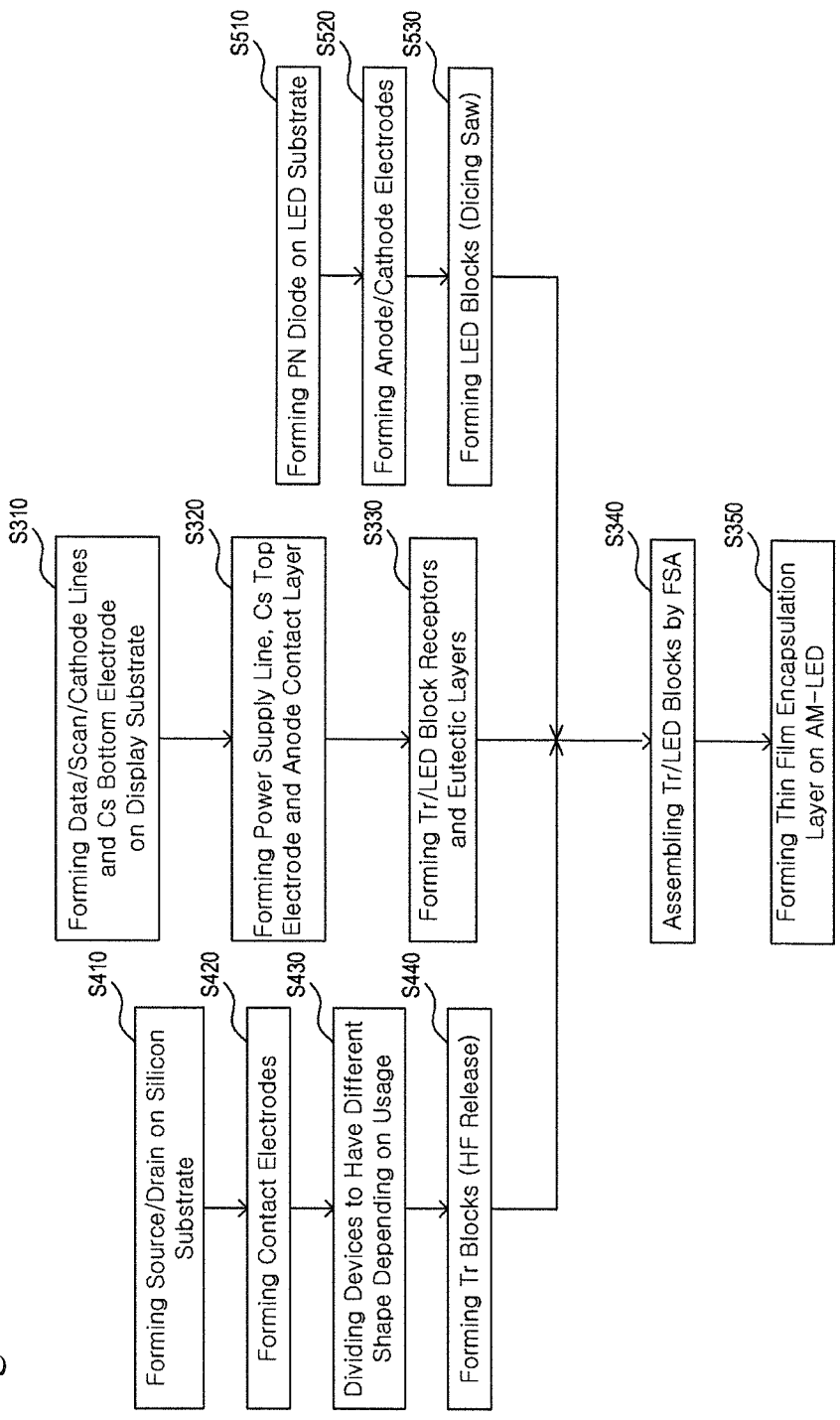
FIG. 20 is a flowchart for a second embodiment on a fabricating method of an AM-LED display apparatus according to the present invention.

Also, the transistor blocks 7 and 8 assembled into the each transistor block receptor 71 or 81 can be formed to have a conventional transistor structure. However, for corresponding to the shape of the each transistor block receptor 71 or 81, as shown in FIGS. 18 and 19, the various structures of the transistor blocks can be formed and be used as followings: sources 74 and 804 and drains 75 and 805 are formed on the SOI substrates 73 and 803, respectively and then each source electrode 77 or 807 and each drain electrode 79 or 809 are connected to the source 74 or 804 and the drain 75 or 805, respectively and each gate electrode 78 or 808 is formed on a gate insulator 76 or 806 with a gate (in FIG. 18) or without a gate (in FIG. 19).

Here, the LED substrate 42 can be a sapphire substrate. Depending on each color element, the nitrogen compound can be preferable to be MN, GaN, InN, or a compound of nitrogen and two or more elements of Al, Ga and In. The each electrode 47, 47a, 46, 46a, 50, 77, 78, 79, 85, 807, 808 or 809 can be preferable to be Ti, W, Cr, Au, Ag, Ni, or a compound comprising one or more elements of Ti, W, Cr, Au, Ag and Ni.

Also, the each eutectic layer 212, 214, 222, 224, 226, 232, 234 or 236 can be preferable to be a metal, more preferably one of Sn, Pb, Bi and In, a compound comprising one or more elements of Sn, Pb, Bi and In, or a metal compound comprising one element of Sn, Pb, Bi and In and one or more elements of Ag, Sb, Cu, Zn and Mg.

Next, with respect to FIGS. 10 to 20, a method for fabricating the structure of an AM-LED display apparatus according to a second embodiment of the present invention is described in detail.

First, as a first step S310, as shown in FIG. 16, a conductive material is deposited on a display substrate 10 and the conductive material is etched to form a scan line 80, a cathode line 60 and a storage capacitor bottom electrode 50.

As a second step S320, as shown in FIG. 17, a first insulating layer 72 and a conductive material are deposited sequentially on a whole surface of the substrate and the conductive material is etched to form a power supply line 82, a storage capacitor top electrode 85 and an anode contact layer 84.

Figure 12:
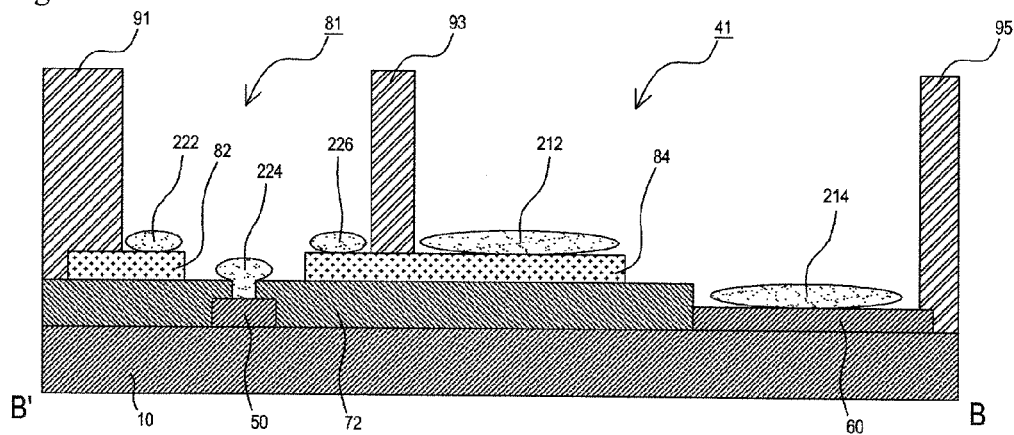
FIGS. 12 and 13 are cross-section views of lines BB' and CC' in FIG. 11 to illustrate a stacked structure, an LED block receptor, and each transistor block receptor according to the present invention.
Figure 13:
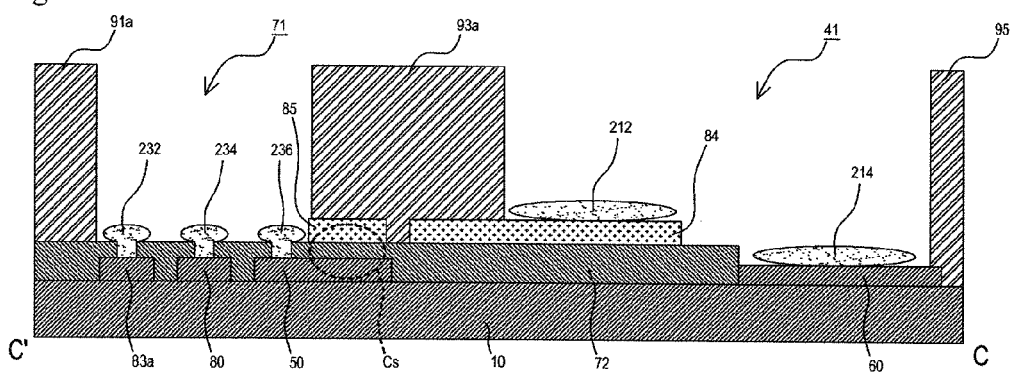

As a third step S330, as shown in FIGS. 12 and 13, a second insulating layer is deposited on a whole surface of the substrate and etched to form a switching transistor block receptor 71, a driving transistor block receptor 81 and an LED block receptor 41 in a color element unit, and eutectic layers 212, 214, 222, 224, 226, 232, 234 and 236 are formed in the each receptor.

At this time, as shown in FIG. 10, the LED block receptor 41 can be formed to have a different shape depending on a color element and the each transistor block receptor 71 or 81 can be formed to have a different shape depending on the function. Additionally, all the receptors 41, 71 and 81 can be preferable to be formed to have a recessed region with a wide opening and a narrow bottom as shown in FIG. 2.

Also, after forming the receptors 41, 71 and 81, via holes are formed for connecting electrically to each wiring on the bottom layer before forming the eutectic layers.

Figure 14:
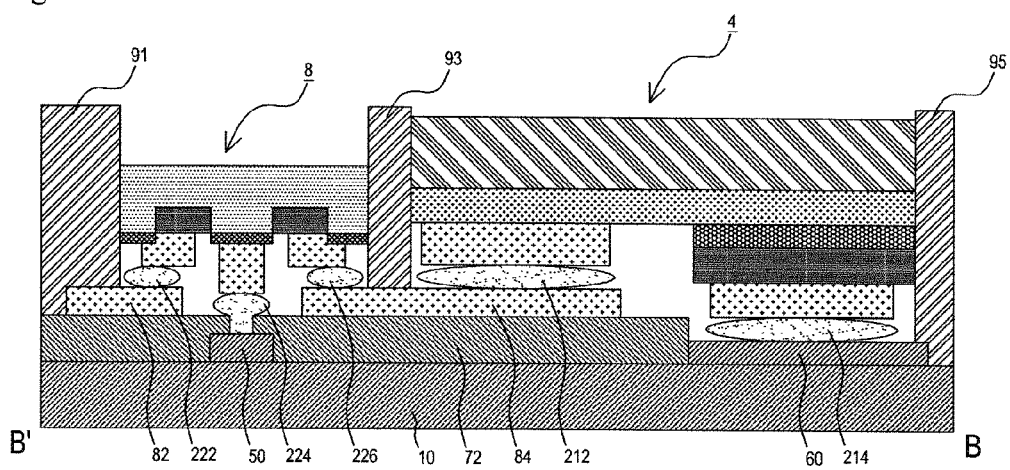
FIGS. 14 to 17 are cross-section views to illustrate the each structure of the blocks assembled into each receptor in FIG. 12 or FIG. 13 in an AM-LED display apparatus according to the present invention.
Figure 15:
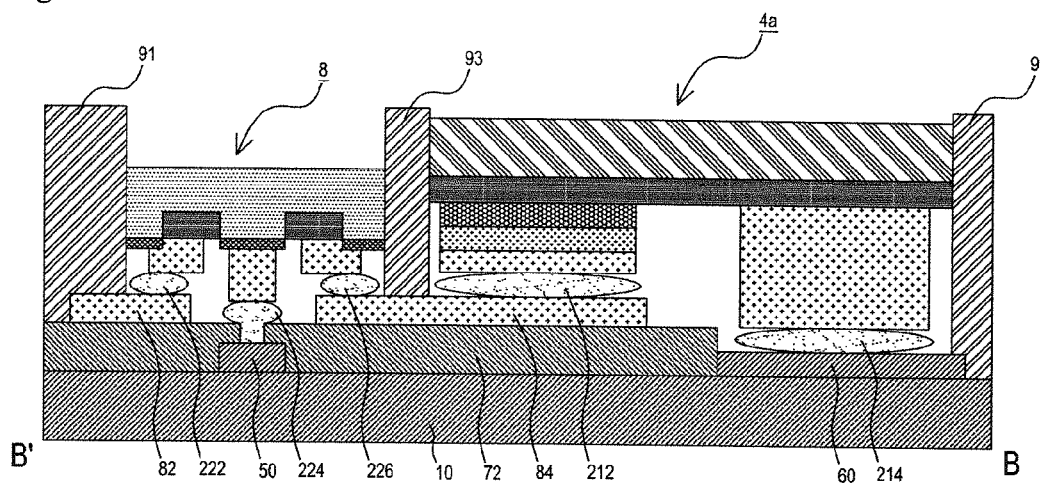

As a fourth step S340, as shown in FIGS. 14 to 16, a switching transistor block 7, a driving transistor block 8 and an LED block 4 are assembled into the each receptor 41, 71 or 81 by a fluidic self-assembly (FSA).

Here, the each transistor block 7 or 8 is fabricated by a separated process, as shown in FIG. 18 or 19, namely, which comprises forming a source 74 or 804/a drain 75 or 805 on a SOI substrate 73 or 803 consisted of a bottom substrate 70 or 801/a buried oxide layer 72 or 802/a top substrate (S410), forming contact electrodes 77, 78 and 79; 807, 808 and 809 (S420), dividing the devices to have a different shape depending on the usage or function (S430) and etching the buried oxide layer 72 or 802 by HF solution to form the each transistor block 7 or 8 (S440).

Also, the LED block 4 or 4a is fabricated by a separated process, which comprises forming a PN diode on an LED substrate (S510), forming an anode/a cathode electrode (S520) and forming an LED block 4 or 4a corresponded to the shape of an LED block receptor 41 by dicing saw (S530).

By the separating process, the transistor blocks 7 and 8 and the LED block 4 or 4a are fabricated to have different shapes depending on the usage and the color element, respectively and are put onto a substrate formed with the corresponding block receptors 41, 71 and 81 and immersed in a fluid.

In the fluid, the blocks can be moved by gravity and/or fluid vibration and can be safely received in the each corresponding receptor 41, 71 or 81 by a self-shape recognition principle or hydrophilic and hydrophobic properties.

When the receptors 41, 71 and 81 are formed to have a recessed region with a wide opening and a narrow bottom, respectively, as shown in FIG. 2 and the blocks 4, 4a, 7 and 8 are formed to correspond to the each receptor 41, 71 or 81, as mentioned above, the mismatched blocks can be jumped out by gravity and/or fluid vibration and the rightly received blocks are safely held by a capillary force.

After the blocks 4, 4a, 7 and 8 are safely received into the each receptor 41, 71 or 81, the temperature of the fluid is increased to the lowest meting point of the eutectic layers 212, 214, 222, 224, 226, 232, 234 and 236 and then decreased to completely assemble the electrodes of the safely received block with the exposed wirings in the each receptor.

The rate of assembly of the blocks into the each receptor can be increased by repeating the fourth step.

After the fluidic self-assembly (FSA) process in the fourth step, a vacant receptor in the entire pixels of display can be detected and saved with a coordinate site by using an automated optical inspection (AOI) and then can be assembled with the corresponded block by pick-and-place process using a robot.

The others, the undescribed parts, can be referred to the U.S. Pat. No. 5,545,291 related to the FSA process.

An optional step S350, as shown in FIG. 17, can be further processed to form a thin film encapsulation layer 99 on the substrate assembled with the blocks 4, 4a, 7 and 8.

[Third Embodiment]

A structure of an AM-LED display apparatus according to a third embodiment of the present invention comprises basically, as shown in FIG. 10, a plurality of pixels 2 formed on the display substrate 3 and consisted of three color element units 1, respectively. The each color element unit 1 is formed by assembling a switching transistor block 7, a driving transistor block 8 and an LED block 4 made previously into a switching transistor block receptor, a driving transistor block receptor and an LED block receptor, respectively, which are formed on the substrate 3.

Figure 21:
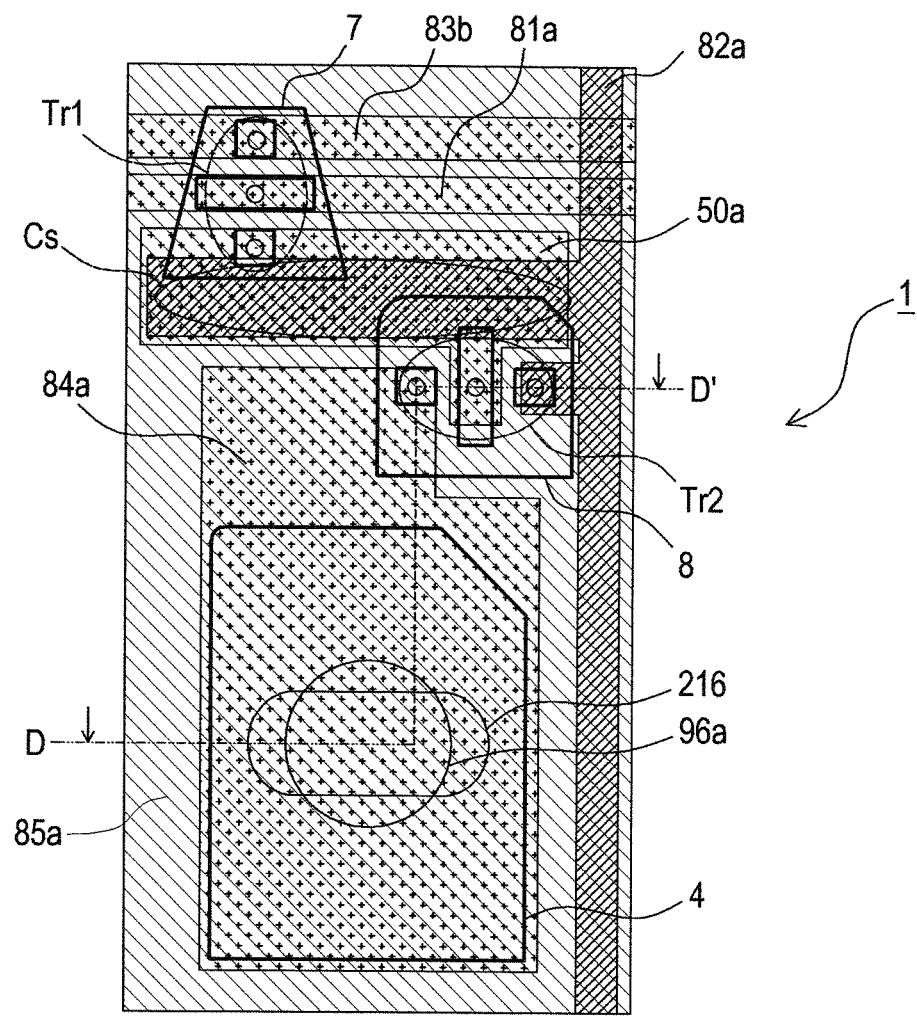
FIG. 21 is another layout to illustrate a structure of any one color element in FIG. 10.

The plane structure of one color element unit 1 according to the third embodiment is shown with a layout in FIG. 21. The structures formed on the same layer are marked with the same color in FIG. 21.

As shown in FIGS. 21 to 31, a structure according to the third embodiment is characterized by comprising: a power supply line 82a formed on a substrate 10; a storage capacitor bottom electrode 85a connected electrically and vertically to the power supply line 82a on the substrate in a color element unit; a first insulating layer 74 formed to cover the power supply line 82a and the storage capacitor bottom electrode 85a on the substrate; a data line 83b and a scan line 80a formed parallel to each other and formed vertically to the power supply line 82a on the first insulating layer; a storage capacitor top electrode 50a formed to overlap the storage capacitor bottom electrode 85a and near by the scan line 80a on the first insulating layer in a color element unit; an anode contact layer 84a formed separately from and near by the storage capacitor top electrode 50a on the first insulating layer in a color element unit; a switching transistor block receptor (not shown), a driving transistor block receptor 81 and an LED block receptor 41 formed with a second insulating layer 91, 92 or 94 to cover at least one part of the data line 83b, the scan line 80a, the storage capacitor top electrode 50a and the anode contact layer 84a on the first insulating layer in a color element unit; a source eutectic layer (not shown), a gate eutectic layer (not shown) and a drain eutectic layer (not shown) of the switching transistor formed separately from each other and connected electrically to the data line 83b, the scan line 80a and the storage capacitor top electrode 50a, respectively, in the switching transistor block receptor (not shown); a gate eutectic layer 244, a source eutectic layer 242 and a drain eutectic layer 246 of a driving transistor formed separately from each other and connected electrically to the storage capacitor top electrode 50a, the power supply line 82a and the anode contact layer 84a, respectively, in the driving transistor block receptor 81; an anode eutectic layer 216 connected electrically to the anode contact layer 84a in the LED block receptor 41; a switching transistor block (not shown) of the color element unit assembled into the switching transistor block receptor (not shown) through electrical connections of the source eutectic layer (not shown), the gate eutectic layer (not shown) and the drain eutectic layer (not shown) of the switching transistor to a source electrode, a gate electrode and a drain electrode of the switching transistor block, respectively; a driving transistor block 8 of the color element unit assembled into the driving transistor block receptor 81 through electrical connections of the source eutectic layer 242, the gate eutectic layer 244 and the drain eutectic layer 246 of the driving transistor to a source electrode, a gate electrode and a drain electrode of the driving transistor block, respectively; an LED block 4b or 4c of the color element unit assembled into the LED block receptor 41 through electrical connection of the anode eutectic layer 216 to an anode electrode 47b or 47c of the LED block; a color element defining layer 96 formed with a third insulating layer to expose a part of the LED block 4b or 4c on the substrate assembled with the each block; and a cathode contact layer, more preferably a cathode line, 60a formed to connect electrically to the exposed part of the LED block 4b or 4c on the color element defining layer 96.

Here, the switching transistor Tr1 and the driving transistor Tr2 can be formed on an amorphous or polycrystal semiconductor substrate, but the driving transistor Tr2 is preferable to be formed on a single-crystal silicon substrate due to the operation of an LED by a driving current.

And the each eutectic layer is preferable to be a metal or a metal compound with a melting point lower than those of the power supply line 82, the storage capacitor bottom electrode 85a, the data line 83b, the scan line 80a, the storage capacitor top electrode 50a, the anode contact layer 84a, the each source electrode, the each gate electrode and the each drain electrode.

Figure 29:
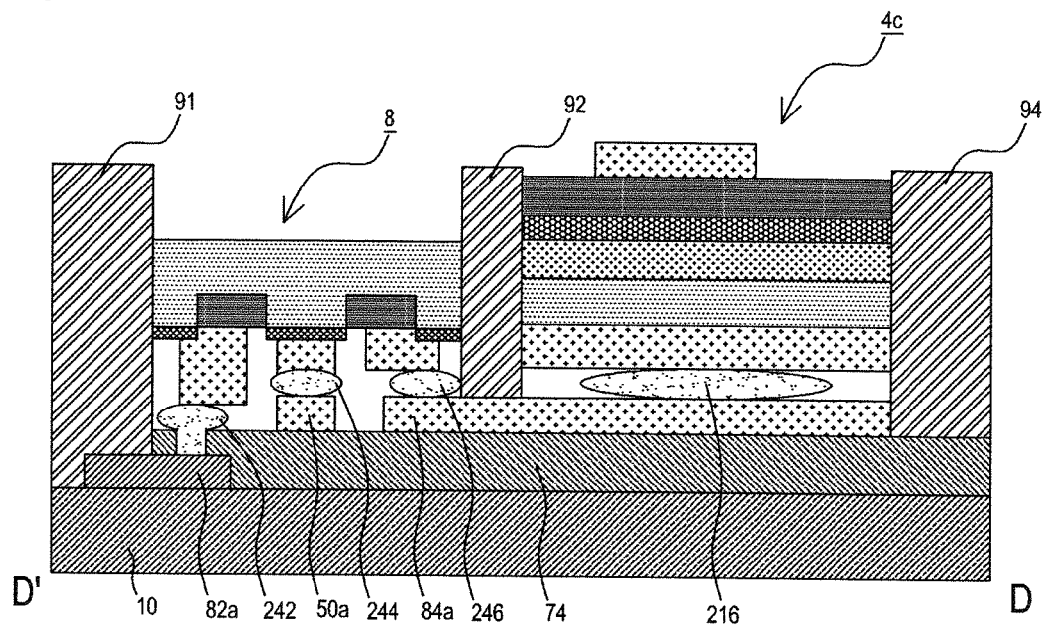
Figure 30:
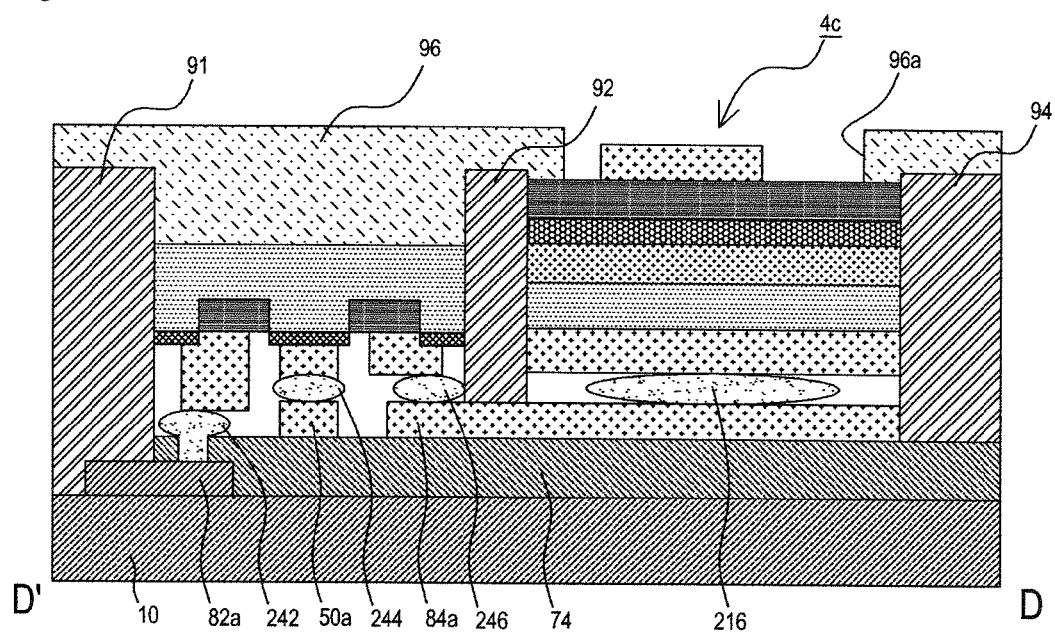
Figure 31:
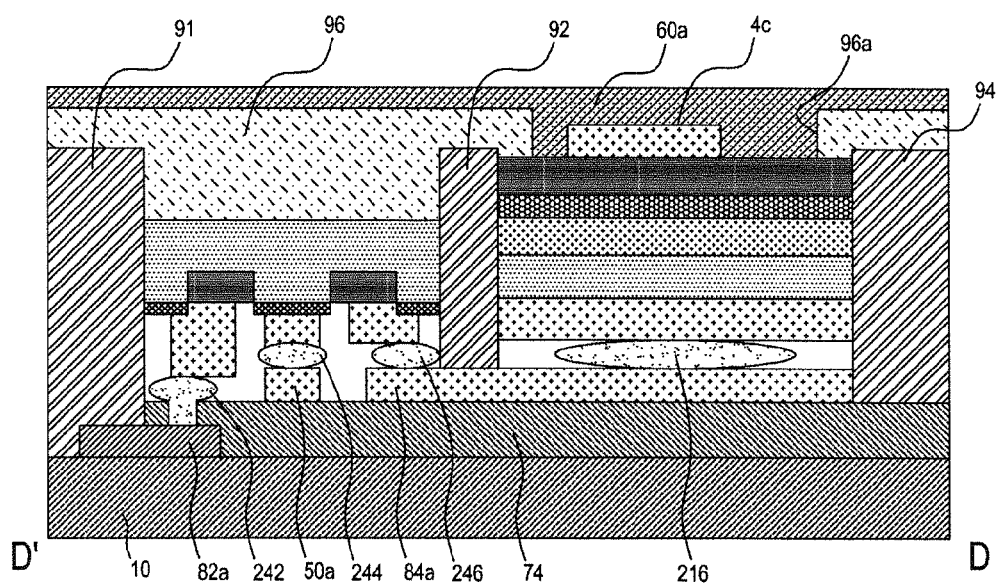
Figure 32:
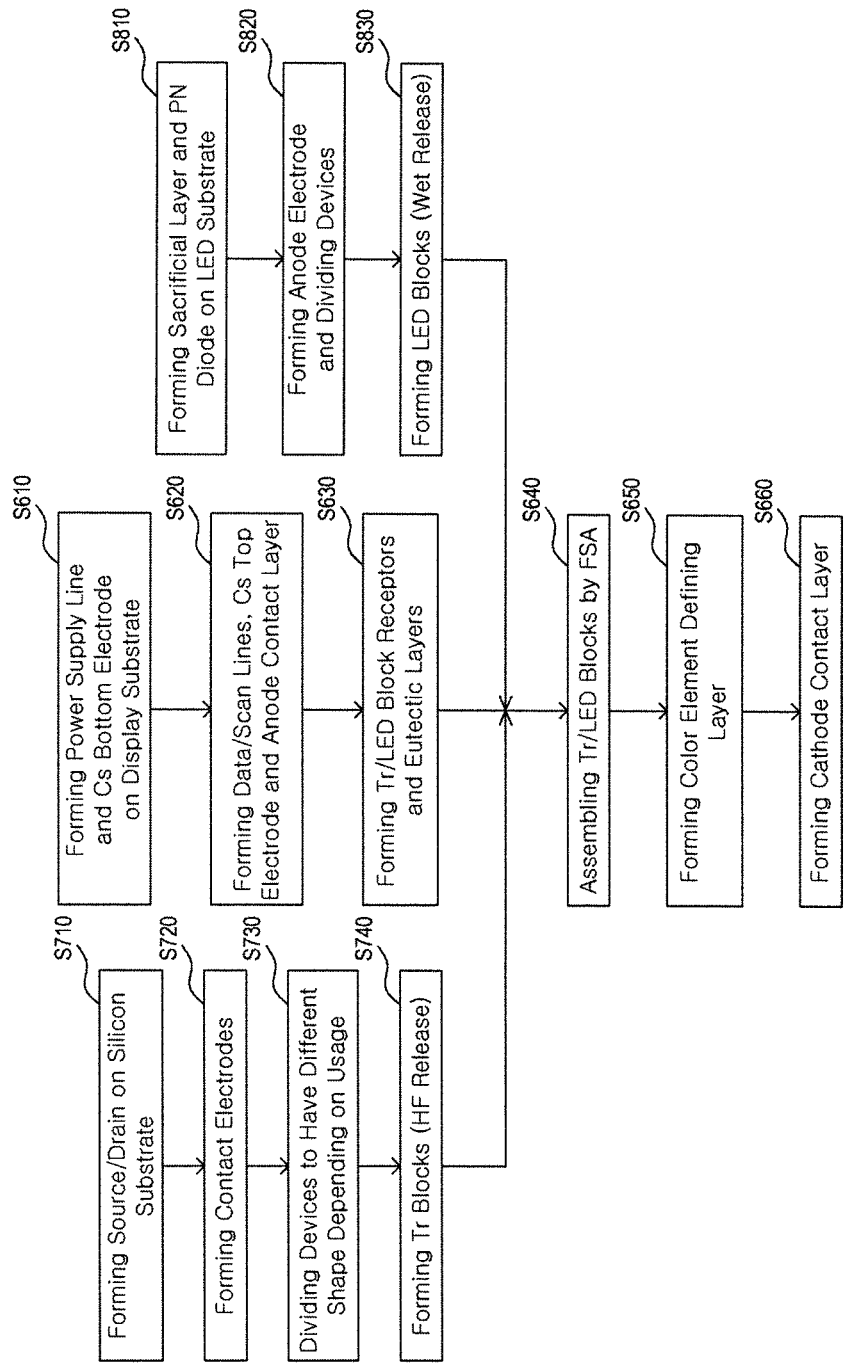
FIG. 32 is a flowchart for a third embodiment on a fabricating method of an AM-LED display apparatus according to the present invention.

Also, as shown in FIGS. 29 to 31, the LED block 4c can be electrically connected to the cathode contact layer 60a through the cathode electrode 46c formed on one side of the LED block.

In the structure according to the third embodiment, the LED block receptor 41 has preferably a recessed region with different plane structure depending on the color element as shown in FIG. 10 and the LED block 4b or 4c assembled into the LED block receptor 41 has also preferably a shape corresponded to the recessed region.

In this way, an LED display 3 can be evenly embodied with a plurality of pixels 2 consisted of three color elements R 4, G 5 and B 6, respectively.

Also, as shown in FIG. 10, the switching transistor block receptor has preferably a recessed region with different plane structure from the driving transistor block receptor 81 and each transistor block 7 or 8 assembled into the each transistor block receptor has also preferably a transistor substrate 73 or 803 with a shape corresponded to the recessed region.

In this way, when the height of the eutectic layers contacted to each electrode of the each transistor is different each other, an only corresponding transistor can be selected to assemble. Also, only driving transistors Tr2 formed on a single-crystal silicon substrate can be selected and used to assemble.

More preferably, as shown in FIG. 2, the LED block receptor 41 and the transistor block receptors 81 can be formed to have the recessed region with a wide opening and a narrow bottom, and the blocks 4b, 4c, 7 and 8 can be formed to correspond to the shape of the each receptor.

In this case, when the blocks are safely received to the each receptor by a self-shape recognition principle using gravity and/or fluid vibration, the mismatched blocks can be jumped out and the rightly received blocks are safely held by a capillary force.

Figure 24:
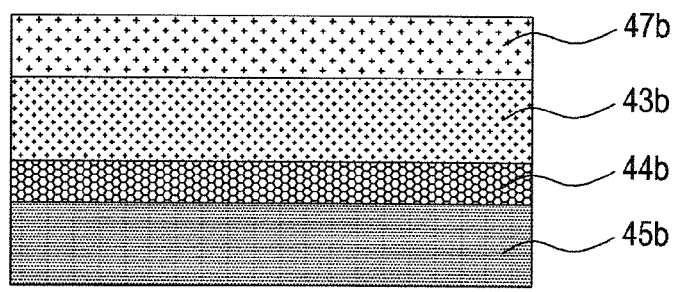
Figure 25:
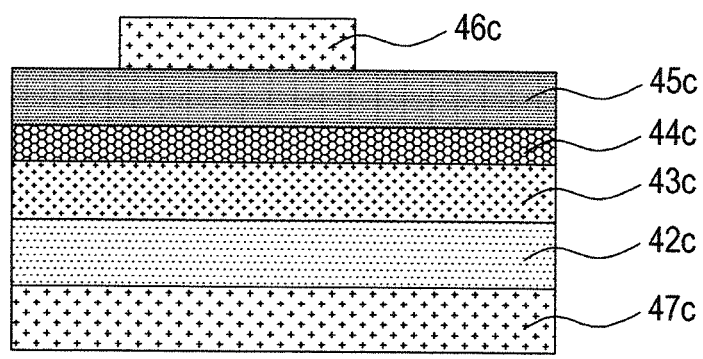
FIG. 25 is a cross-section view to illustrate another fabricating method of a LED block assembled into a LED block receptor in FIG. 22.
Figure 26:
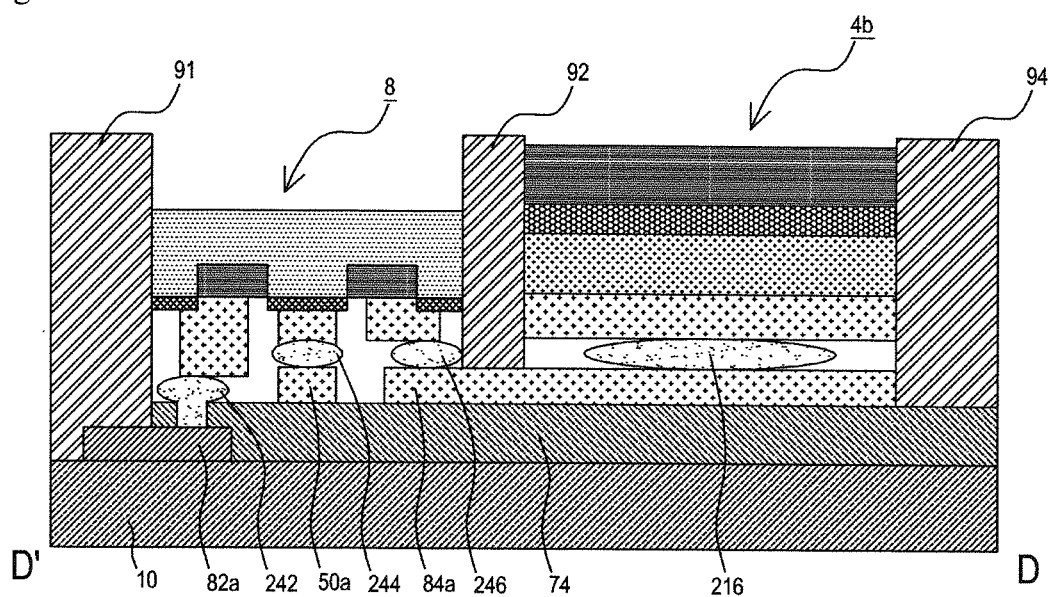
FIGS. 26 to 31 are cross-section views to illustrate the each structure of the blocks assembled into each receptor in FIG. 22 in an AM-LED display apparatus according to the present invention.

On the other hand, the LED block assembled into the LED block receptor 41 can be formed to have a conventional LED structure. However, for corresponding to the shape of each LED block receptor 41, the LED block, as shown in FIG. 24, can be stacked sequentially from the bottom to have an n-type compound semiconductor 45b/compound activation layer 44b/p-type compound semiconductor 43b with a shape of a wide bottom and a narrow top for reversely assembling in a receptor or the LED block, as shown in FIG. 25, can be stacked sequentially from the bottom to have an anode electrode 47c/LED substrate as SiC 42c/p-type compound semiconductor 43c/compound activation layer 44c/n-type compound semiconductor 45c/cathode electrode 46c with a shape of a wide top and a narrow bottom for directly assembling in a receptor.

Also, the transistor blocks 7 and 8 assembled in the each transistor block receptor can be formed to have a conventional structure of transistor. However, for corresponding to the shape of the each transistor block receptor, the transistor blocks 7 and 8, as shown in FIGS. 18 and 19, can be formed and be used as followings: sources 74 and 804 and drains 75 and 805 are formed on the SOI substrates 73 and 803, respectively and then each source electrode 77 or 807 and each drain electrode 79 or 809 are connected to the source 74 or 804 and the drain 75 or 805, respectively and each gate electrode 78 or 808 is formed on a gate insulator 76 or 806 with a gate (in FIG. 18) or without a gate (in FIG. 19).

Here, the LED substrate 42 can be a sapphire substrate. The compound semiconductor can be preferable to be GaAs, AlN, GaN, InN, or a compound of nitrogen and two or more elements of Al, Ga and In. The each electrode can be preferable to be Ti, W, Cr, Au, Ag, Ni, or a compound comprising one or more elements of Ti, W, Cr, Au, Ag and Ni.

Also, the each eutectic layer can be preferable to be a metal, more preferably one of Sn, Pb, Bi and In, a compound comprising one or more elements of Sn, Pb, Bi and In, or a metal compound comprising one element of Sn, Pb, Bi and In and one or more elements of Ag, Sb, Cu, Zn and Mg.

Next, with respect to FIGS. 21 to 32, a method for fabricating the structure of an AM-LED display apparatus according to a third embodiment of the present invention is described in detail.

Figure 22:
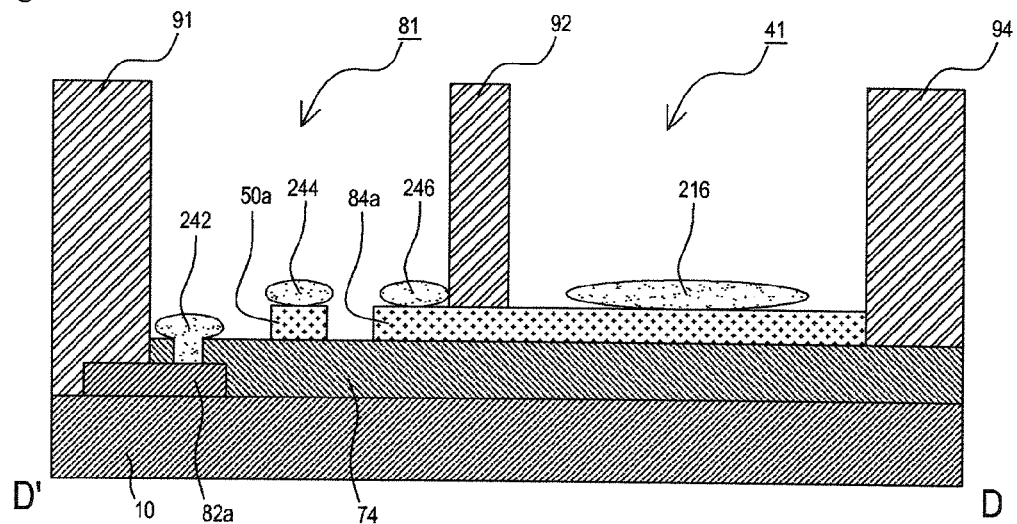
FIG. 22 is cross-section view of a line DD' in FIG. 21 to illustrate a stacked structure, an LED block receptor, and a transistor block receptor according to the present invention.

First, as a first step S610, as shown in FIG. 22, a conductive material is deposited on a display substrate 10 and the conductive material is etched to form a power supply line 82a and a storage capacitor bottom electrode 85a.

As a second step S620, as shown in FIG. 21, a first insulating layer and a conductive material are deposited sequentially on a whole surface of the substrate and the conductive material is etched to form a data line 83b, a scan line 80a, a storage capacitor top electrode 50a, and an anode contact layer 84a.

As a third step S630, as shown in FIG. 22, a second insulating layer is deposited on a whole surface of the substrate and etched to form a switching transistor block receptor (not shown), a driving transistor block receptor 81 and an LED block receptor 41 in a color element unit, and eutectic layers 212, 214, 222, 224, 226, 232, 234 and 236 are formed in the each receptor.

At this time, as shown in FIG. 10, the LED block receptor 41 can be formed to have a different shape depending on a color element and the each transistor block receptor 81 can be formed to have a different shape depending on the function. Additionally, all the receptors 41 and 81 can be preferable to be formed to have a recessed region with a wide opening and a narrow bottom as shown in FIG. 2.

Also, after forming the receptors, via holes are formed for connecting electrically to each wiring on the bottom layer before forming the eutectic layers.

As a fourth step S640, as shown in FIGS. 26 to 29, a switching transistor block 7, a driving transistor block 8 and an LED block 4b or 4c are assembled into the each corresponding receptor by a fluidic self-assembly (FSA).

Here, the each transistor block 7 or 8 is fabricated by a separated process, as shown in FIG. 18 or 19, namely, which comprises forming a source 74 or 804/a drain 75 or 805 on a SOI substrate 73 or 803 consisted of a bottom substrate 70 or 801/a buried oxide layer 72 or 802/a top substrate (S710), forming the contact electrodes 77, 78 and 79; 807, 808 and 809 (S720), dividing the devices to have a different shape depending on the usage or function (S730) and etching the buried oxide layer 72 or 802 by HF solution to form the each transistor block 7 or 8 (S740).

Figure 23:
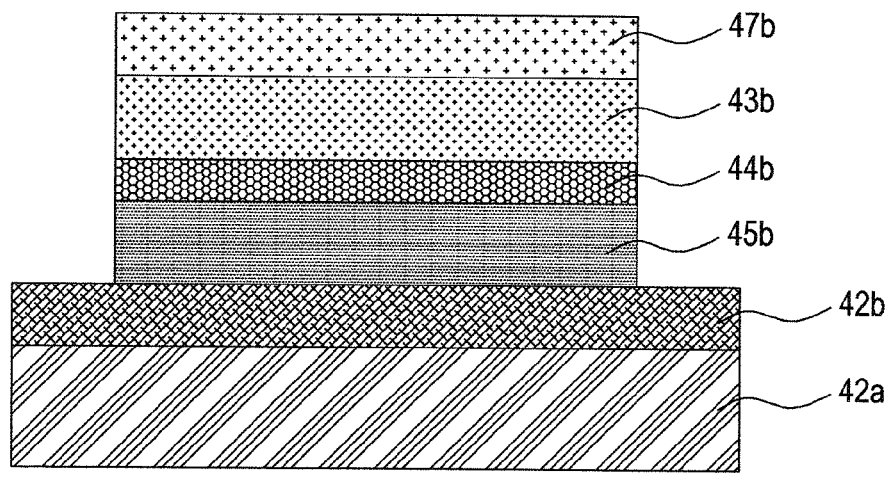
FIGS. 23 and 24 are cross-section views to illustrate one fabricating method of an LED block assembled into an LED block receptor in FIG. 22.

Also, the LED block 4b is fabricated by a separated process, as shown in FIGS. 23 and 24, which comprises depositing a sacrificial layer 42b and forming a PN diode on an LED substrate 42a (S810), forming an anode electrode 47b and dividing the devices to fit a shape of an LED block receptor (S820), and etching the sacrificial layer 42b by wet etching to form the LED block 4b (S830).

By the separating process, the transistor blocks 7 and 8 and the LED block 4b or 4c are fabricated to have different shapes depending on the usage and the color element, respectively and are put onto a substrate formed with the corresponding block receptors 41 and 81 and immersed in a fluid.

In the fluid, the blocks can be moved by gravity and/or fluid vibration and can be safely received in the each corresponding receptor 41 or 81 by a self-shape recognition principle or hydrophilic and hydrophobic properties.

When the receptors 41 and 81 are formed to have a recessed region with a wide opening and a narrow bottom, respectively, as shown in FIG. 2 and the blocks 4b, 4c, 7 and 8 are formed to correspond to the each receptor, as mentioned above, the mismatched blocks can be jumped out by gravity and/or fluid vibration and the rightly received blocks are safely held by a capillary force.

After the blocks 4b, 4c, 7 and 8 are safely received into the each receptor 41 or 81, the temperature of the fluid is increased to the lowest meting point of the eutectic layers and then decreased to completely assemble the electrodes of the safely received block with the exposed wirings in the each receptor.

The rate of assembly of the blocks into the each receptor can be increased by repeating the fourth step.

After the fluidic self-assembly (FSA) process in the fourth step, a vacant receptor in the entire pixels of display can be detected and saved with a coordinate site by using an automated optical inspection (AOI) and then can be assembled with the corresponded block by pick-and-place process using a robot.

The others, the undescribed parts can be referred to the U.S. Pat. No. 5,545,291 related to the FSA process.

Figure 27:
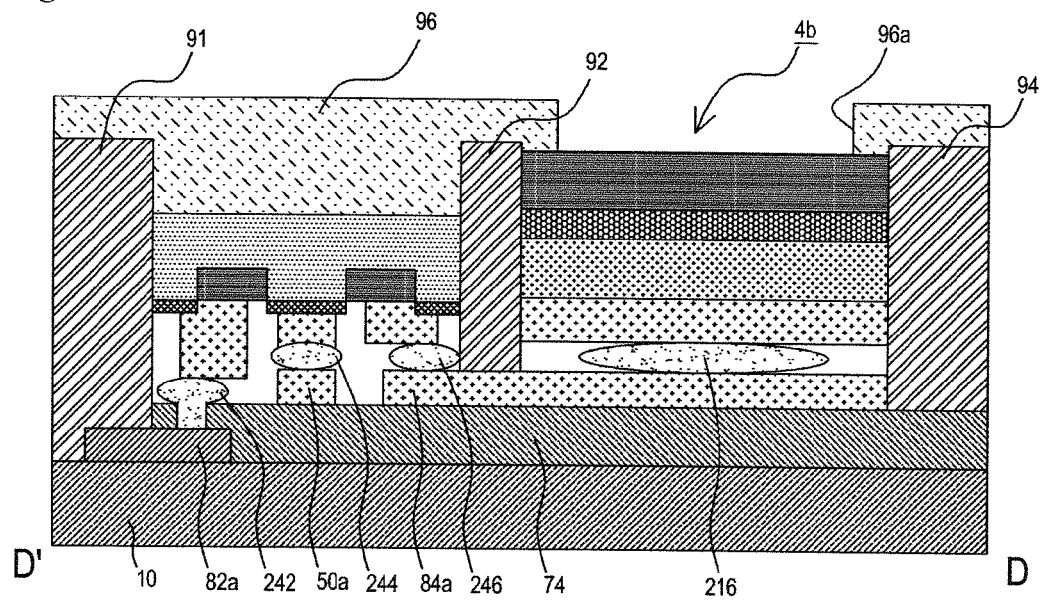

As a fifth step S650, as shown in FIG. 27 or 30, a third insulating layer is deposited on a whole surface of the substrate and etched to form a color element defining layer 96 and a part of the assembled LED block 4b or 4c is exposed through a hole 96a of the color element defining layer 96.

Figure 28:
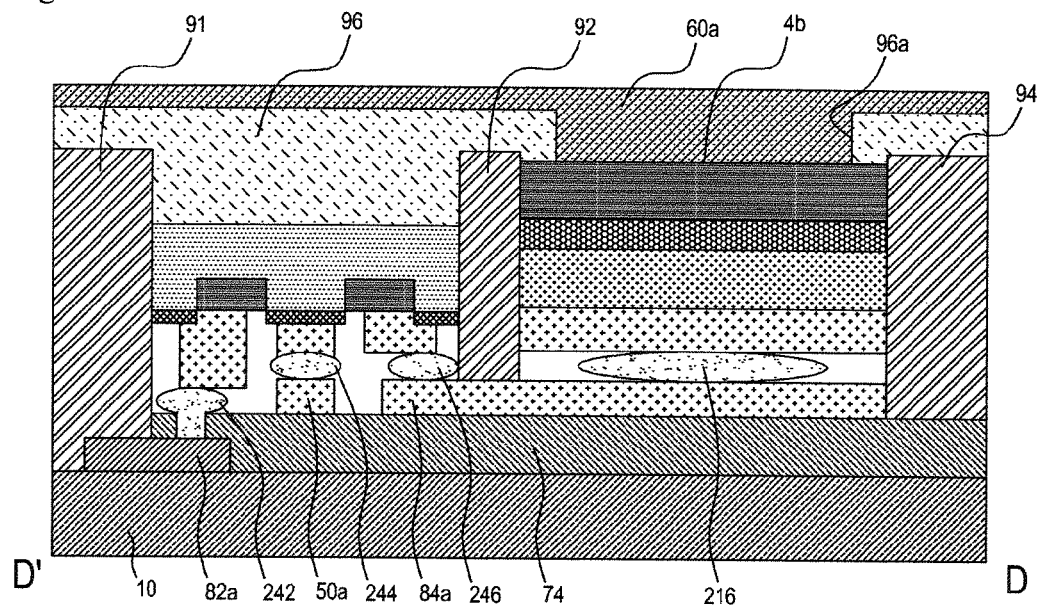

As a sixth step S660, as shown in FIG. 28 or 31, a transparent or semitransparent conductive material is deposited on a whole surface of the substrate to form a cathode contact layer, more preferably a cathode line, 60a connected electrically to the exposed LED block 4b or 4c.

By the above-mentioned, the concreted embodiments of an AM-LED display apparatus and a fabrication method thereof according to the present invention are described in detail. However, because it is described to be understood and practiced by a person with ordinary skill in the art, the expression of the source/drain of the each transistor can be expressed by change each other in the mentioned embodiments. Also, the stacking sequence of the LED and the place of the cathode and the anode electrodes in the mentioned embodiments can be allowed to change.

What is claimed is:

1. An LED display apparatus comprising:
a buffer layer formed on a substrate;
a switching transistor active layer and a driving transistor active layer formed separately from each other and having a source and a drain in both sides of the each active layer on the buffer layer in a color element unit;
a first insulating layer formed to cover the switching and the driving transistor active layers on the substrate;
a scan line formed across between the source and the drain of the switching transistor on the first insulating layer;
a cathode line formed parallel to and separately from the scan line on the first insulating layer;
a storage capacitor bottom electrode formed across between the source and the drain of the driving transistor and connected electrically to the drain of the switching transistor on the first insulating layer in a color element unit;
a second insulating layer formed to cover the scan line, the cathode line and the storage capacitor bottom electrode on the first insulating layer;
a data line formed vertically to the scan line and connected electrically to the source of the switching transistor on the second insulating layer;
a power supply line formed parallel to and separately from the data line and connected electrically to the source of the driving transistor on the second insulating layer;
a storage capacitor top electrode formed to overlap the storage capacitor bottom electrode and connected electrically to the power supply line on the second insulating layer in a color element unit;
an anode contact layer formed between the data line and the power supply line and connected electrically to the drain of the driving transistor on the second insulating layer in a color element unit;
an LED block receptor formed with a third insulating layer to cover at least one part of the data line, the power supply line, the storage capacitor top electrode and the anode contact layer on the second insulating layer in a color element unit;
a cathode eutectic layer and an anode eutectic layer formed separately from each other and connected electrically to the cathode line and the anode contract layer, respectively, in the LED block receptor; and
an LED block of the color element unit assembled into the LED block receptor through electrical connections of the cathode eutectic layer and the anode eutectic layer to a cathode electrode and an anode electrode of the LED block, respectively.

2. The LED display apparatus of claim 1,
wherein the buffer layer is a silicon oxide layer or a silicon nitride layer,
wherein the switching transistor active layer and the driving transistor active layer are a poly-silicon layer, and
wherein the cathode eutectic layer and the anode eutectic layer are a metal or a metal compound with a melting point lower than those of the scan line, the cathode line, the storage capacitor bottom electrode, the data line, the power supply line, the storage capacitor top electrode and the anode contact layer.

3. The LED display apparatus of claim 1,
wherein on the substrate assembled with the LED block, a thin film encapsulation layer is additionally formed.

4. The LED display apparatus of claim 1,
wherein the LED block receptor has a recessed region with different plane structure depending on a color element, and
wherein the LED block has an LED substrate with a shape corresponded to the recessed region.

5. The LED display apparatus of claim 2,
wherein the LED block receptor has a recessed region with different plane structure depending on a color element, and
wherein the LED block has an LED substrate with a shape corresponded to the recessed region.

6. The LED display apparatus of claim 3,
wherein the LED block receptor has a recessed region with different plane structure depending on a color element, and
wherein the LED block has an LED substrate with a shape corresponded to the recessed region.

7. The LED display apparatus of claim 4,
wherein the LED block receptor is formed to have a wide opening and a narrow bottom, and
wherein the LED block, for corresponding to the shape of the LED block receptor, has a p-type nitrogen compound semiconductor layer/nitrogen compound activation layer/n-type nitrogen compound semiconductor layer/cathode electrode and a p-type nitrogen compound semiconductor layer/anode electrode formed near by in the same direction of each other on the LED substrate or has an n-type nitrogen compound semiconductor layer/ nitrogen compound activation layer/p-type nitrogen compound semiconductor layer/anode electrode and an n-type nitrogen compound semiconductor layer/cathode electrode formed near by in the same direction of each other on the LED substrate.

8. The LED display apparatus of claim 5, wherein the LED block receptor is formed to have a wide opening and a narrow bottom, and wherein the LED block, for corresponding to the shape of the LED block receptor, has a p-type nitrogen compound semiconductor layer/nitrogen compound activation layer/n-type nitrogen compound semiconductor layer/ cathode electrode and a p-type nitrogen compound semiconductor layer/anode electrode formed near by in the same direction of each other on the LED substrate or has an n-type nitrogen compound semiconductor layer/ nitrogen compound activation layer/p-type nitrogen compound semiconductor layer/anode electrode and an n-type nitrogen compound semiconductor layer/cathode electrode formed near by in the same direction of each other on the LED substrate.

9. The LED display apparatus of claim 6, wherein the LED block receptor is formed to have a wide opening and a narrow bottom, and wherein the LED block, for corresponding to the shape of the LED block receptor, has a p-type nitrogen compound semiconductor layer/nitrogen compound activation layer/n-type nitrogen compound semiconductor layer/ cathode electrode and a p-type nitrogen compound semiconductor layer/anode electrode formed near by in the same direction of each other on the LED substrate or has an n-type nitrogen compound semiconductor layer/ nitrogen compound activation layer/p-type nitrogen compound semiconductor layer/anode electrode and an n-type nitrogen compound semiconductor layer/cathode electrode formed near by in the same direction of each other on the LED substrate.

10. The LED display apparatus of claim 7, wherein the LED substrate is a sapphire, wherein the nitrogen compound is AlN, GaN, InN, or a compound of nitrogen and two or more elements of Al, Ga and In, and wherein the anode electrode and the cathode electrode are Ti, W, Cr, Au, Ag, Ni, or a compound comprising one or more elements of Ti, W, Cr, Au, Ag and Ni.

11. The LED display apparatus of claim 8, wherein the LED substrate is a sapphire, wherein the nitrogen compound is AlN, GaN, InN, or a compound of nitrogen and two or more elements of Al, Ga and In, and wherein the anode electrode and the cathode electrode are Ti, W, Cr, Au, Ag, Ni, or a compound comprising one or more elements of Ti, W, Cr, Au, Ag and Ni.

12. The LED display apparatus of claim 9, wherein the LED substrate is a sapphire, wherein the nitrogen compound is AlN, GaN, InN, or a compound of nitrogen and two or more elements of Al, Ga and In, and wherein the anode electrode and the cathode electrode are Ti, W, Cr, Au, Ag, Ni, or a compound comprising one or more elements of Ti, W, Cr, Au, Ag and Ni.

13. The LED display apparatus of claim 10, wherein the cathode eutectic layer and the anode eutectic layer are Sn, Pb, Bi, In, a compound comprising one or more elements of Sn, Pb, Bi and In, or a compound comprising one element of Sn, Pb, Bi and In and one or more elements of Ag, Sb, Cu, Zn and Mg.

14. The LED display apparatus of claim 11, wherein the cathode eutectic layer and the anode eutectic layer are Sn, Pb, Bi, In, a compound comprising one or more elements of Sn, Pb, Bi and In, or a compound comprising one element of Sn, Pb, Bi and In and one or more elements of Ag, Sb, Cu, Zn and Mg.

15. The LED display apparatus of claim 12, wherein the cathode eutectic layer and the anode eutectic layer are Sn, Pb, Bi, In, a compound comprising one or more elements of Sn, Pb, Bi and In, or a compound comprising one element of Sn, Pb, Bi and In and one or more elements of Ag, Sb, Cu, Zn and Mg.

\* \* \* \* \*